US010398059B2

(12) United States Patent
Williams et al.

(10) Patent No.: US 10,398,059 B2
(45) Date of Patent: *Aug. 27, 2019

(54) SYSTEM AND METHOD FOR CRYOGENIC COOLING OF ELECTROMAGNETIC INDUCTION FILTER

(71) Applicant: The Boeing Company, Chicago, IL (US)

(72) Inventors: John Dalton Williams, Decatur, AL (US); Timothy Doyle Messer, Madison, AL (US); John R. Hull, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/984,876

(22) Filed: May 21, 2018

(65) Prior Publication Data

US 2018/0270988 A1 Sep. 20, 2018

Related U.S. Application Data

(63) Continuation of application No. 15/371,580, filed on Dec. 7, 2016, now Pat. No. 10,015,908.

(51) Int. Cl.
*H05K 7/20* (2006.01)
*H01F 27/10* (2006.01)
(Continued)

(52) U.S. Cl.
CPC ....... *H05K 7/20272* (2013.01); *H01F 17/062* (2013.01); *H01F 27/025* (2013.01); *H01F 27/105* (2013.01); *H01F 2017/065* (2013.01)

(58) Field of Classification Search
CPC ............. H01F 17/20272; H01F 27/025; H01F 27/105; H01F 2017/065; H05K 7/20272
See application file for complete search history.

(56) References Cited

U.S. PATENT DOCUMENTS 10,015,908 B2 * 7/2018 Williams ........... H05K 7/20272
2006/0261000 A1 * 11/2006 Bassett .................. B01D 35/30
210/435

(Continued)

OTHER PUBLICATIONS

"U.S. Appl. No. 15/371,580, Non Final Office Action dated Dec. 6, 2017", 9 pages.
(Continued)

*Primary Examiner* — David M Sinclair
*Assistant Examiner* — Robert D Brown
(74) *Attorney, Agent, or Firm* — Kwan & Olynick LLP

(57) ABSTRACT

Provided is a cooling device, and methods of fabricating and operating such cooling devices, for electromagnetic induction (EMI) filters. Specifically, a cooling device is provided which comprises a housing enclosing the electromagnetic induction filter. The housing may comprise one or more of the following: one or more exterior chambers, one or more central flow channels, and peripheral flow channels. The one or more exterior chambers surround an exterior surface of the EMI filter. The one or more central flow channels extend the length of the center of the EMIR filter. The peripheral flow channels extend the length of the exterior of the electromagnetic induction filter. The peripheral flow channels may be disposed between one or more exterior chambers and open into the one or more exterior chambers. The one or more central flow channels, the peripheral flow channels, and the one or more exterior chambers are interconnected.

20 Claims, 22 Drawing Sheets

(51) Int. Cl.
*H01F 17/06* (2006.01)
*H01F 27/02* (2006.01)

(56) References Cited

U.S. PATENT DOCUMENTS

| | | | | |
|---|---|---|---|---|
| 2013/0037061 A1* | 2/2013 | Grieve | ............... | B01D 41/04 |
| | | | | 134/22.18 |
| 2013/0074906 A1* | 3/2013 | Siskavich | ............... | H02S 10/30 |
| | | | | 136/246 |
| 2015/0239757 A1* | 8/2015 | Hughes | ............... | C02F 1/487 |
| | | | | 204/557 |
| 2018/0160567 A1* | 6/2018 | Williams | ............ | H05K 7/20272 |

OTHER PUBLICATIONS

"U.S. Appl. No. 15/371,580, Notice of Allowance dated Apr. 17, 2018", 7 pages.
"CoolPoly D5112 Data Sheet", Celanese Inc., 1 pg., 2015.
"EMC Products Based on Nanocrystalline Vitroperm", Vacuumschmelze GmbH & Co. KG, Hanau, 2016, 28 pgs.
"Low Temperature Properties of Polymers", Zeus Industrial Products, Inc., 2005, 6 pgs.
"Rexolite Order Rexolite Online", Product Information, http://www.polymerplastics.com/Rexolite-High-Performance-Plastic, 4 pgs.
"Rexolite Specifications", Product Information, http://www.rexolite.com/specifications/, 3 pgs.
Cotronics Corp, , "Rescore Castable Ceramics", http://sflee.co.kr/composites/CotronicsE/cat55/onepg700.pdf, 2014.
Crossnail Laminates, , "G10 Cryogenic Specifications", http://www.g10fr4.com/g10_fr4_technical_data_specifications.html, 2015, 2 pgs.
Crossnail Laminates, , "G10 FR4 Specifications", http://www.g10fr4.com/g10_fr4_technical_data_specifications.html, 2015, 2 pgs.
Cruz, P. et al., "Tensile strengths of polyamide based on 3D printed polymers in liquid nitrogen", ICMC 2015; IOP Conference Series: Materials Science and Engineering 102, 2015, 7 pgs.
Cytec, , "PEKK Thermoplastic Polymer Technical Data Sheet", https://www.cytec.com/sites/default/files/datasheets/PEKK_032012-02.pdf, 2015, 6 pgs.
Fu, Shao-Yun , "Chapter 2: Cryogenic Properties of Polymer Materials", Springer-Verlag Berlin Heidelberg, Technical Institute of Physics and Chemistry, Chinese Academy of Sciences, Beijing, China, 2013, pp. 9-39.
Hechtel, K. , "Design Considerations for use of plastic materials in cryogenic environments", https://www.curbellplastics.com/Research-Solutions/Industry-Solutions/Challenging-Environments/Plastics-for-Extreme-Temperature-Applications, Oct. 2014, 1-19.
Kasen, M.B. et al., "Mechanical, Electrical and Thermal Characterization of G-10DC and G-11CR Glass-Cloth /Epoxy Laminates Between Room Temp and 4K", National Institute of Standards, PB2137456, 1980, 10 pgs.
Ohira, K et al., "Pressure drop reduction and heat transfer deterioration of slush nitrogen in horizontal pipe flow", Cryogenics, vol. 51, 2011, 563-574.
Theiler, Geraldine , "PTFE- and PEEK-Matrix Composites for Tribological Applications at Cryogenic Temperatures and in Hydrogen", Bundesanstalt für Materialforschung und-prüfung (BAM), 2005, 132 pgs.
Vitrex, , "VICTREX PEEK 450G Data Sheet", https://www.victrex.com/~/media/datasheets/victrex_tds_450g.ashx, 2015.
Weiss, K-P et al., "Thermal and mechanical properties of selected 3D printed thermoplastics in the cryogenic temperature regime", ICMC 2015; IOP Conf. Series: Materials Science and Engineering 102, 2015, 8 pgs.

\* cited by examiner

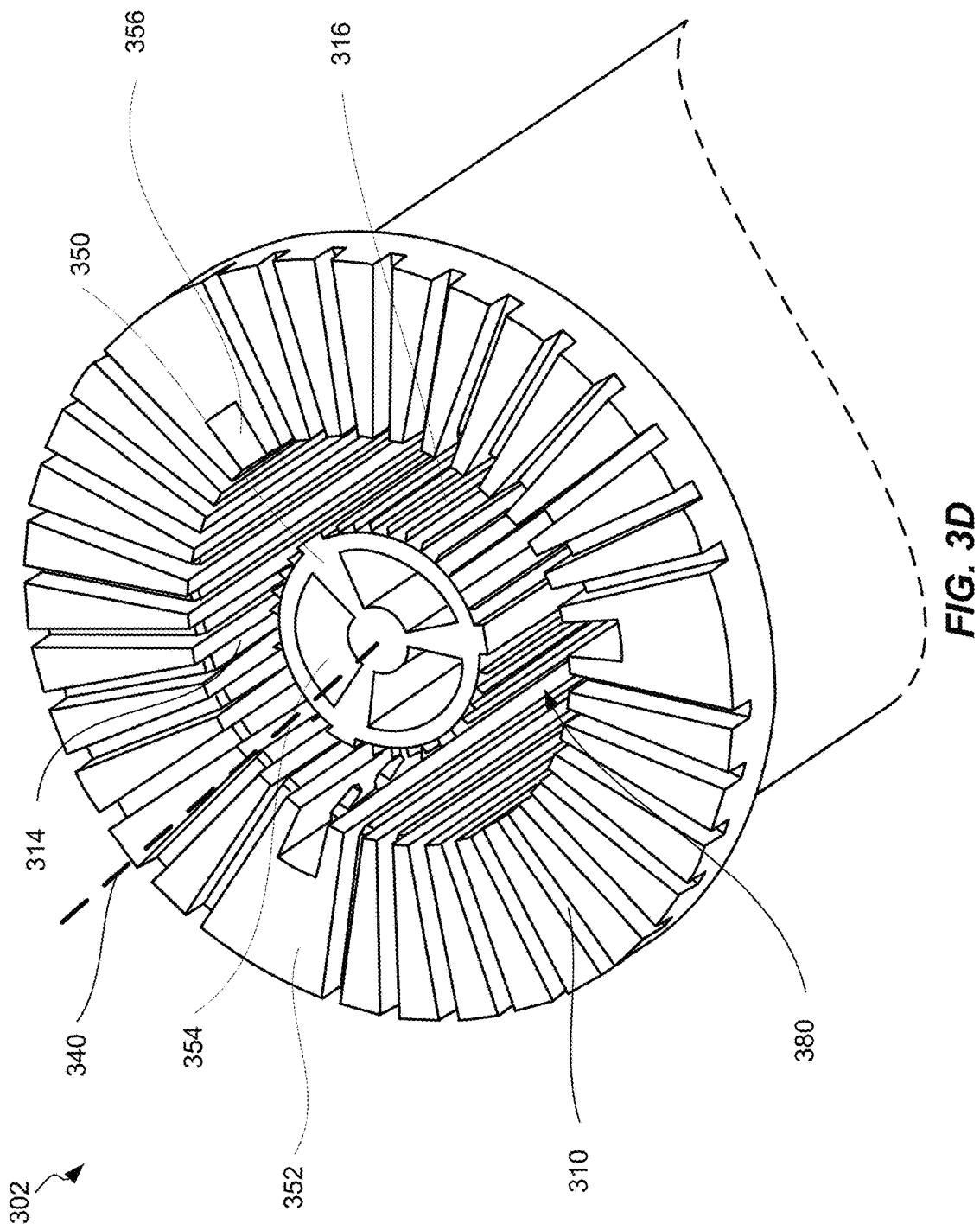

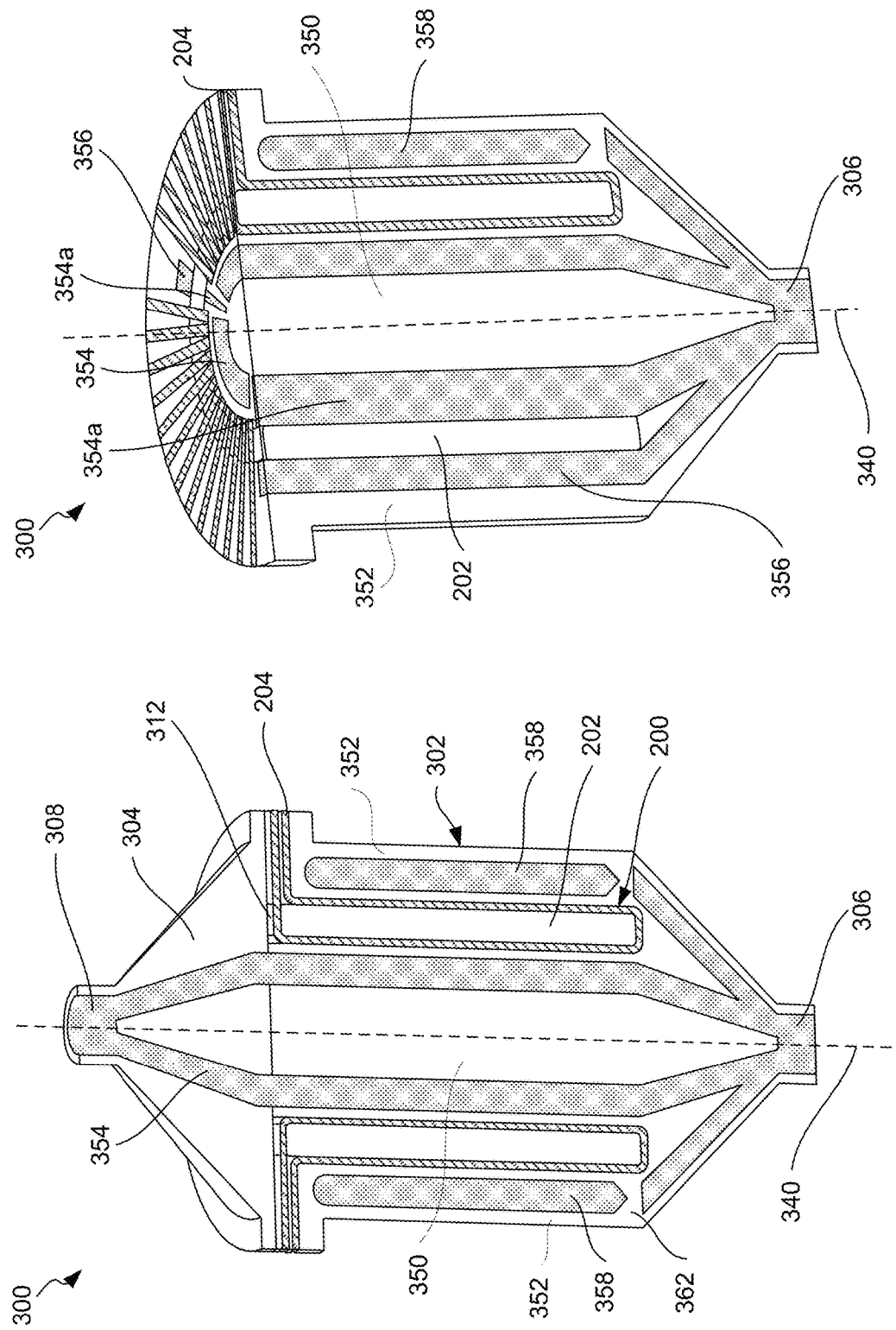

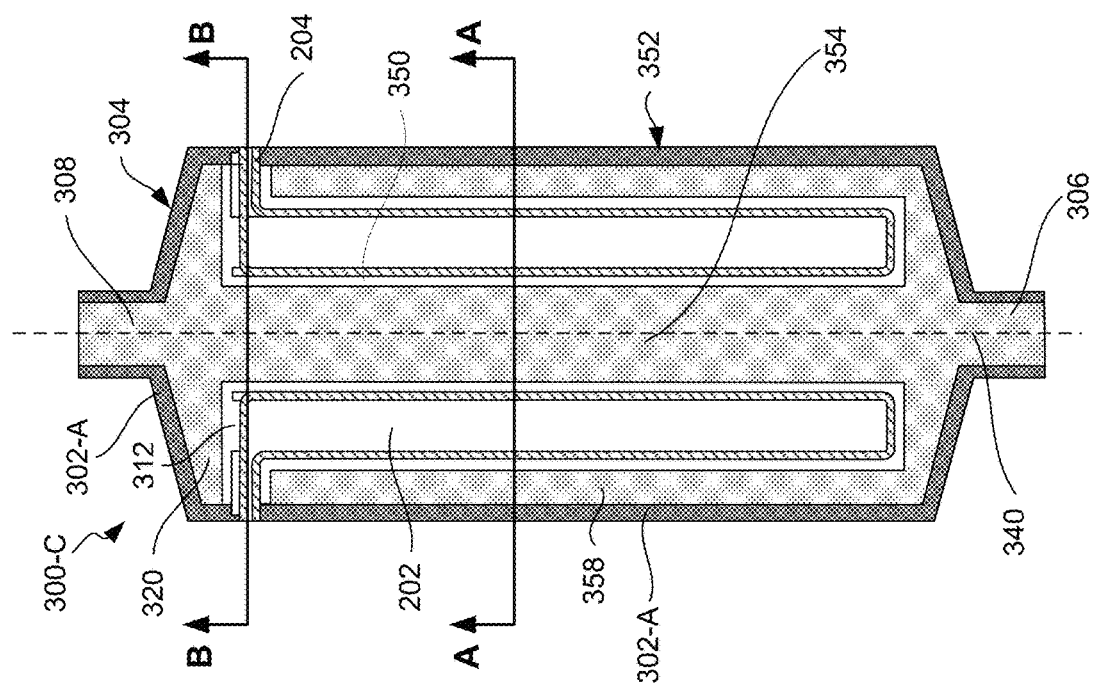
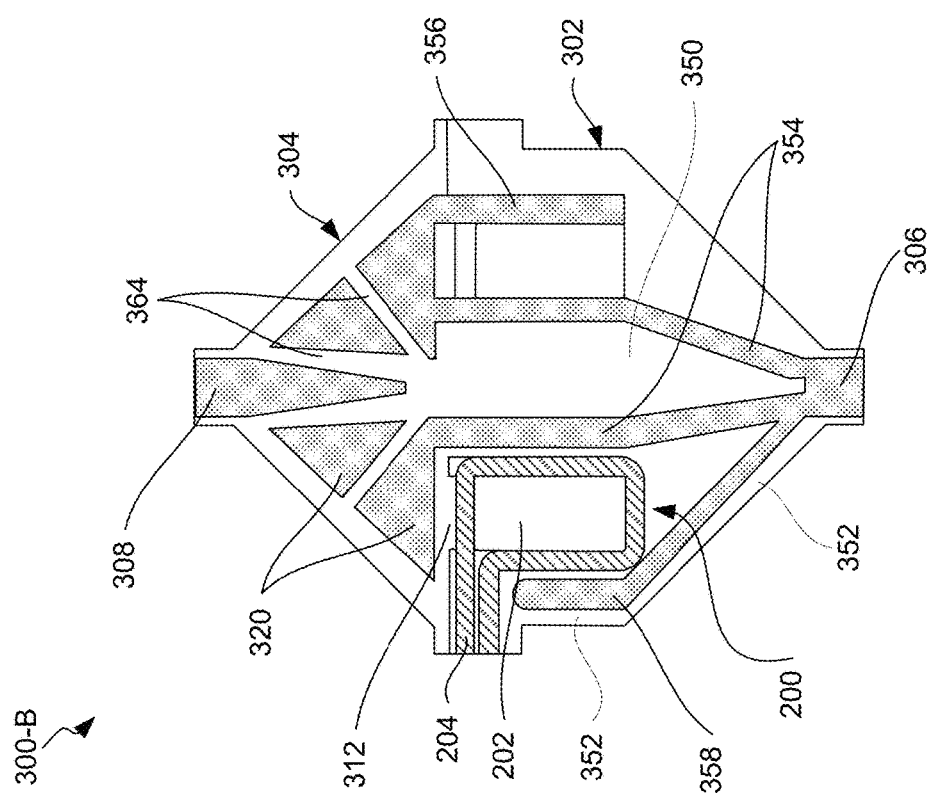
FIG. 4E
FIG. 4D

SYSTEM AND METHOD FOR CRYOGENIC COOLING OF ELECTROMAGNETIC INDUCTION FILTER

CROSS-REFERENCE TO RELATED APPLICATIONS

This application is a continuation of U.S. patent application Ser. No. 15/371,580 entitled: "SYSTEM AND METHOD FOR CRYOGENIC COOLING OF ELECTROMAGNETIC INDUCTION FILTER" filed on Dec. 7, 2016, which is incorporated herein by reference in its entirety for all purposes.

TECHNICAL FIELD

The present disclosure relates generally to electromagnetic induction filters, and more specifically to common mode chokes comprising toroidal magnetic inductors.

BACKGROUND

Electromagnetic interference (EMI), also known as radio frequency interference (RFI), is an unacceptable electromagnetic disturbance generated by an external source that affects an electrical circuit by electromagnetic induction, electrostatic coupling, or conduction. Electromagnetic noises may be natural noises (e.g., lightning and static electricity) or artificial noises (e.g., contact noise, leaking from high frequency devices, etc). The disturbance may results in the degradation or malfunction of electronic or electrical equipment. Major sources of EMI include microprocessors, switching power supplies, AC motors, and electrical power cords.

EMI filters are passive electronic devices that are used to suppress conducted interference that is found on a signal or power line, including interference created by other equipment, as well as the interference of the system itself, resulting in improved immunity from EMI signals in the surrounding setting.

An EMI filter may comprise of multiple components including inductors (or chokes) and capacitors. An inductor may comprise insulated conductive wire wrapped around a toroidal magnetic core. The current is passed through the conductive wire from a power source and then onto a load. The passing current causes the inductor to heat up, especially at higher amperes (amps). High temperatures can reduce performance and/or efficiency of the electronic device, as well as cause damage to the device and the filter choke itself.

Standard methods for insulating and maintaining proper operational temperatures of EMI filters is achieved by encasing the filter in an electrical potting material and blowing cold air over the surface. However, as the space for electrical components decreases, it becomes increasingly difficult to maintain desired temperatures through airflow alone. Thus, there is a need for cooling an inductor of an EMI filter operating at high voltages in a closed space.

SUMMARY

The following presents a simplified summary of the disclosure in order to provide a basic understanding of certain embodiments of this disclosure. This summary is not an extensive overview of the disclosure, and it does not identify key and critical elements of the present disclosure or delineate the scope of the present disclosure. Its sole purpose is to present some concepts disclosed herein in a simplified form as a prelude to the more detailed description that is presented later.

Provided is a cooling device, and methods of fabricating and operating such cooling devices, for electromagnetic induction (EMI) filters. Specifically, a cooling device is provided which comprises a housing enclosing the electromagnetic induction filter. The housing may comprise one or more of the following: one or more exterior chambers, one or more central flow channels, and peripheral flow channels. The one or more exterior chambers may surround an exterior surface of the EMI filter. The one or more central flow channels may extend the length of the center of the EMI filter. The peripheral flow channels may extend the length of the exterior of the electromagnetic induction filter. The peripheral flow channels may be disposed between one or more exterior chambers and open into the one or more exterior chambers. The one or more central flow channels, the peripheral flow channels, and the one or more exterior chambers are interconnected.

The housing may further comprise a base portion and a cap portion. The EMI filter is disposed within a main cavity of the base portion and is enclosed by the cap portion. The base portion and the cap portion may be clamped together to enclose the electromagnetic induction filter. The main cavity may be formed by a central structure of the base portion and a peripheral structure of the base portion. The one or more exterior chambers may be disposed within the peripheral structure of the base portion. The one or more central flow channels may be disposed within the central structure and the peripheral flow channels may be disposed within the peripheral structure. Each of the base portion and the cap portion may include a portion of the one or more central flow channels and the peripheral flow channels. The cap portion may also include one or more upper cavities. The one or more upper cavities are interconnected with one or more of the following, the one or more central flow channels and the peripheral flow channels.

The peripheral flow channels may be disposed symmetrically around a longitudinal axis of the cooling device. The one or more central flow channels may also be disposed symmetrically around the longitudinal axis of the cooling device. The one or more central flow channels may be symmetrically offset around the longitudinal axis of the cooling device relative to the peripheral flow channels.

The cooling device may further comprise a pump mechanism for pumping cooling fluid through one or more of the following: the one or more central flow channels, the peripheral flow channels, and the one or more exterior chambers. The cooling fluid may enter an intake port and exit from an output port. The cooling fluid may comprise liquid nitrogen. The cooling fluid may comprise a boiling cryogenic fluid.

The housing may comprise a monolithic structure. The housing may comprise a thermoplastic polymer. The housing may comprise polyether ether ketone (PEEK).

The EMI filter may comprise a toroidal magnetic core and wire segments azimuthly coiled around the magnetic core. The wire segments may be arranged into one or more symmetrically disposed groupings. The peripheral flow channels may be disposed between the groupings of wire segments. The one or more central flow channels may be disposed to correspond to the positions of the groupings of wire segments. The EMI filter may be disposed within the main cavity such that the magnetic core seals the peripheral flow channels. The EMI filter may be disposed within the main cavity such that the magnetic core seals one or more of the one or more central flow channels. The magnetic core may be exposed to an interior of each of the peripheral flow channels. The magnetic core may be exposed to an interior of one or more of the one or more central flow channels.

The wire segments may be physically separated from an interior of each of the one or more central flow channels, the peripheral flow channels, and the one or more exterior chambers. The base portion may comprise a plurality of grooves, including outer vertical wire grooves, inner vertical wire grooves, and horizontal wire grooves. The plurality of grooves are configured to house the wire segments.

The wire segments may be coiled around the magnetic core such that at a first end of the magnetic core, each wire segment includes portions that protrude away from the center of the magnetic core along an axis that is perpendicular to a longitudinal axis of the EMI filter. The cap portion may include one or more upper cavities adjacently disposed to the portions of each wire segment protruding away from the center of the magnetic core along an axis that is perpendicular to a longitudinal axis of the EMI filter. The cooling device may further comprise a pump mechanism for pumping the cooling fluid through the one or more central flow channels, the peripheral flow channels, the one or more exterior chambers, and the one or more upper cavities.

Provided also is a method of fabricating a cooling device for an EMI filter. The method may comprise forming a base portion of a housing. In various aspects, the base portion comprises a main cavity configured to house the EMI filter. The base portion further comprises one or more central flow channels extending the length of the center of the EMI filter. The base portion further comprises exterior chambers surrounding an exterior surface of the EMI filter. The base portion further comprises peripheral flow channels extending the length of the exterior surface of the EMI filter. The peripheral flow channels are disposed between the exterior chambers.

The one or more central flow channels, the peripheral flow channels, the exterior chambers, and the one or more upper cavities are interconnected. The peripheral flow channels may be symmetrically disposed around the main cavity. The one or more central flow channels may be symmetrically disposed around the main cavity and symmetrically offset relative to the peripheral flow channels.

The method may further comprise forming a cap portion of the housing. The cap portion includes one or more upper cavities. The EMI filter may then be inserted into the main cavity. EMI filter may then be enclosed with the cap portion. The method may further comprise welding the cap portion to the base portion.

The EMI filter may comprise a toroidal magnetic core and wire segments azimuthly coiled around the magnetic core. The wire segments may be arranged into one or more symmetrically disposed groupings. The peripheral flow channels may be disposed between the groupings of wire segments when the EMI filter is inserted into main cavity. When the EMI filter is inserted into the main cavity, the magnetic core may be exposed to one or more of the following: the interior of one or more of the one or more central flow channels (354), and the interior of one or more of the peripheral flow channels (356).

The wire segments may be physically separated from an interior of each of the one or more central flow channels, the peripheral flow channels, the exterior chambers, and the one or more upper cavities. The base portion may further comprise a plurality of grooves, including outer vertical grooves, inner vertical grooves, and horizontal grooves. The plurality of grooves are configured to house the wire segments.

Provided also is a method of cooling an EMI filter. The method may comprise encasing the EMI filter within a cooling device. The cooling device may comprise a housing enclosing the EMI filter. The housing may comprise exterior chambers surrounding an exterior surface of the EMI filter. The housing may further comprises one or more central flow channels extending the length of the center of the EMI filter. The housing further comprises peripheral flow channels extending the length of the exterior surface of the EMI filter. The peripheral flow channels are disposed between the exterior chambers. The exterior chambers, the one or more central flow channels, and the peripheral flow channels are interconnected.

The method further comprises pumping a cooling fluid through the one or more center flow channels, the peripheral flow channels, and the exterior chambers. Pumping the cooling fluid establishes a flow of cooling fluid through the cooling device. The cooling fluid may comprise a boiling cryogenic fluid. The cooling fluid may comprise liquid nitrogen. The method may further comprise maintaining the temperature of the liquid nitrogen within a range such that a complete phase transition from a liquid state to a gaseous state does not occur within the cooling device.

The EMI filter may comprise a magnetic core and wire segments azimuthly coiled around the magnetic core. Pumping the cooling fluid may include causing the cooling fluid to contact the magnetic core and preventing the cooling fluid from contacting the wire segments. Pumping the cooling fluid may include inputting the cooling fluid through an intake port of the cooling device and outputting the cooling fluid through an output port of the cooling device. The method may further comprise cycling the cooling fluid from the output port back into the intake port. Pumping the cooling fluid may include causing the cooling fluid to travel through the cooling device at a turbulent flow. The cooling fluid may be pumped through the one or more center flow channels, the peripheral flow channels, and the exterior chambers, at a flow rate between 0.5 to 15 meters per second.

These and other embodiments are described further below with reference to the figures.

BRIEF DESCRIPTION OF THE DRAWINGS

FIGS. 3B-3D are schematic diagrams of a portion of a cooling device, in accordance with one or more embodiments.

FIGS. 4A-4E are schematic cross-sectional views of various cooling devices, in accordance with one or more embodiments.

DETAILED DESCRIPTION

Figure 1:
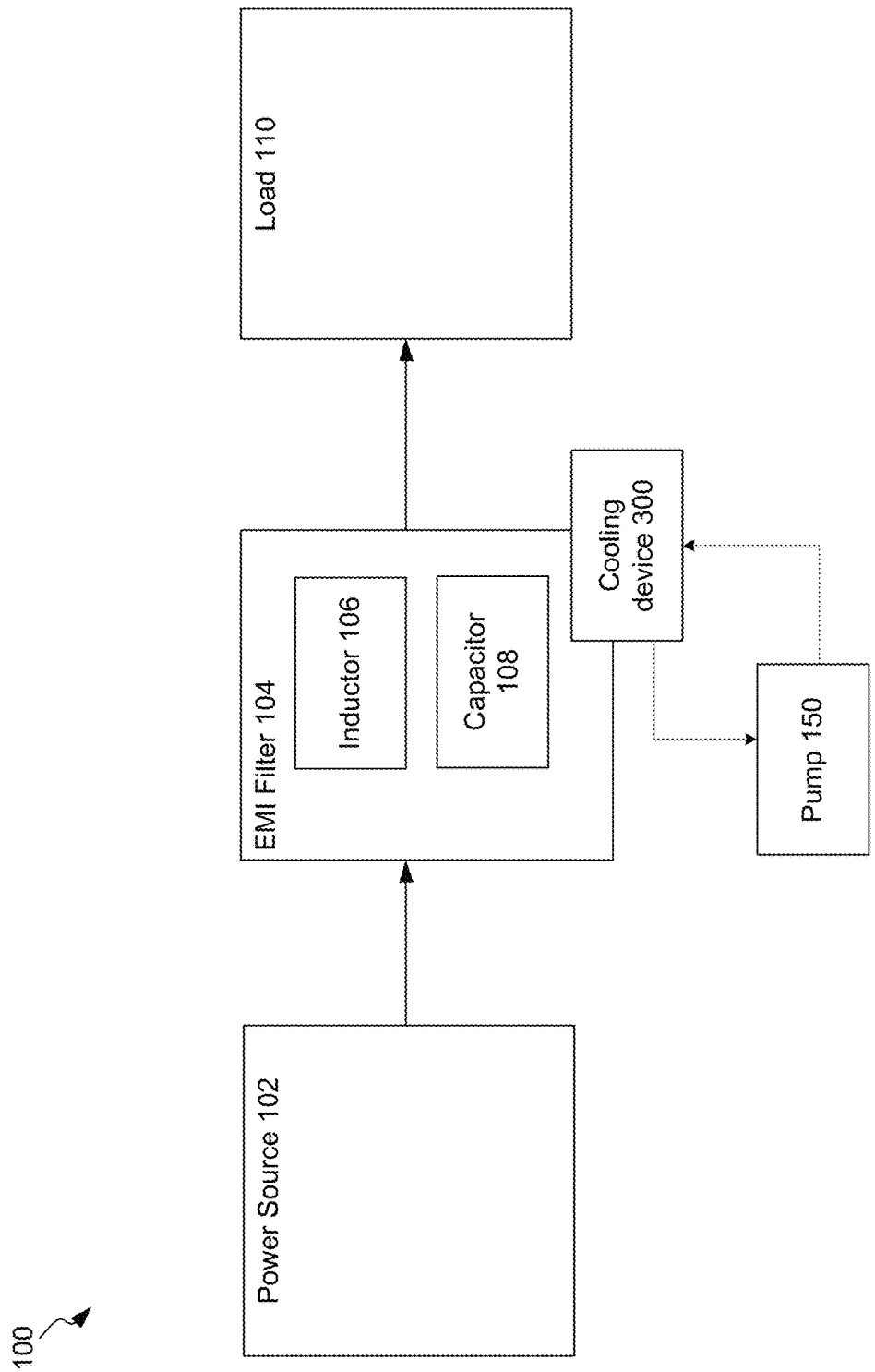
FIG. 1 illustrates an example of an electrical system that can be used in conjunction with the techniques and mechanisms of the present disclosure in accordance with one or more embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting. On the contrary, it is intended to cover alternatives, modifications, and equivalents as may be included within the spirit and scope of the present disclosure as defined by the appended claims.

For example, the techniques of the present disclosure will be described in the context of particular electronic circuit components, such as inductors. However, it should be noted that the techniques and mechanisms of the present disclosure apply to various circuit components, such as capacitors, transistors, etc. In the following description, numerous specific details are set forth in order to provide a thorough understanding of the present disclosure. Particular example embodiments of the present disclosure may be implemented without some or all of these specific details. In other instances, well known process operations have not been described in detail in order not to unnecessarily obscure the present disclosure. Various techniques and mechanisms of the present disclosure will sometimes be described in singular form for clarity. However, it should be noted that some embodiments include multiple iterations of a technique or multiple instantiations of a mechanism unless noted otherwise.

Introduction

The present disclosure describes a novel cooling device for an EMI filter comprising a choke housing. The housing comprises a stack of cylindrical elements to enclose the EMI filter while providing radially symmetric magnetic induction, electrical wiring and connections, and cryogenic cooling with flow around both the inner and outer diameter of each EMI filter. In various aspects, the EMI filter may comprise a toroidal magnetic core with wire segments azimuthly coiled around the magnetic core. The wire segments may be arranged into one or more symmetrically disposed groupings. The housing is configured to allow the EMI filter to be slot fit into a cavity with sufficient precision to either reduce or eliminate the need for cryogenically compatible electrical potting material. Such housing may be patterned and fabricated using one or more thermoformed plastics. Such housing may alternatively, and/or additionally, be machined from standard cryogenic materials such as G-10 fiberglass and cast alumina.

In some aspects, the cooling device provides a controlled path for coolant flow. For example, cooling fluid may comprise liquid nitrogen, or other cryogenically cooled liquid hydrocarbon. The cooling fluid may be pumped into the cooling device through an intake port and into various channels and chambers. Central flow channels extend the length of the center of the EMI filter. Exterior chambers surround an exterior surface of the EMI filter. Peripheral flow channels extend the length of the exterior of the EMI filter and may be disposed between the exterior chambers.

As the cooling fluid travels through the central flow channels and/or the peripheral flow channels, the cooling fluid may make direct contact with the magnetic core of the EMI filter, while being completely separated from the wire segments. Direct contact with the magnetic core may optimize the heat transfer from the EMI filter to the cooling fluid. A cooling fluid, such as liquid nitrogen, may be in a state of incomplete phase transition, comprising a slush of liquid and turbulent gas. Such slush may optimize the heat transfer between the EMI filter and cooling fluid. The cooling fluid may be pumped through the cooling device at a turbulent flow further optimizing heat transfer.

The cooling fluid may then flow into a collection chamber before exiting through an output port. The collection chamber may allow for expansion and collection of heated cooling fluid to reduce pressure and maintain a desired flow rate. The cooling fluid may be cycled from the output port back into the cooling device through the intake port.

The cooling device disclosed herein provides substantial advantages over previous cooling devices and/or methods, including low mass, positional accuracy required to minimize EMI loss, manufactured repeatability, material compatibility with cryogenic fluids, and electrical safety.

Example Embodiments

To better understand implementation of electromagnetic interference (EMI) filters in electrical systems, a brief description of an electrical system is now presented. FIG. 1 illustrates an example of an electrical system 100 that can be used in conjunction with the techniques and mechanisms of the present disclosure in accordance with one or more embodiments. Electrical system 100 comprises a power source 102, which may be a battery or generator. In other embodiments, power source 100 may generate electrical power by various means, such as heat engines heated by combustion, geothermal power, or nuclear fission. Other generators may be driven by kinetic energy or solar photovoltaics.

The electrical current generated by power source is ultimately consumed by electrical load 110. Load 110 is an electrical component or portion of a circuit that consumes electric power. Typically, in electric power circuits, load 110 comprises appliance and lights. In other embodiments load 110 comprises. In some embodiments, load 110 may comprise various electrical components in a vehicle or aircraft, including the following subsystems: engine management, multimedia and heating, ventilation, and air condition (HVAC), body electronics, chassis electrification, and lighting (exterior and interior. In an electric vehicle or aircraft load 110 may also comprise an electric motor.

In some embodiments, the circuits in electrical system may be affected by electromagnetic interference (EMI). Such EMI may be created by various external electrical equipment and/or components, as well as the electrical components in system 100, such as those described in conjunction with load 110. The power source 102 may also act as a source of unwanted EMI disturbances. Major sources of EMI include microprocessors, switching power supplies, AC motors, and electrical power cords. These EMI disturbances can result in the degradation or malfunction of electronic or electrical equipment.

In order to filter out unwanted EMI disturbances, system 100 may comprise EMI filter 104. EMI filter 104 may be coupled to the electrical circuit such that the current generated by power source is filtered by EMI filter 104 before reaching load 110. EMI filter 104 may comprise of multiple components including inductor 106 (or chokes) and capacitor 108 which may be configured in parallel and/or in series within the electrical circuit. Although FIG. 1 depicts a single inductor 106 and a single capacitor 108, one of ordinary skill in the art would appreciate that EMI filter 104 may comprise any number of inductors and/or capacitors.

An inductor 106 in EMI filter 104 may comprise insulated conductive wire wrapped around a toroidal magnetic core. An example of an inductor 106 that can be used in conjunction with the present disclosure is further described with reference to FIGS. 2A-2B. The current is passed through the conductive wire from a power source and then onto a load. As electrical current flows through the conductive wire, the inductor heats up, especially at higher amperes (amps). High temperatures can reduce performance and/or efficiency of the electronic device, as well as cause damage to the device and the filter choke itself.

While the overall concept is well understood, it may be desired to utilize a filter 104 to remove nearly all unwanted efficiency losses and to develop a cooling approach capable of removing hundreds of Watts of thermal loss in order to achieve a MW (megawatt) converter. Thus, it may be required to optimize electrical, magnetic, and thermal losses to achieve an efficient and viable electronic induction device.

To accomplish this, system 100 may include cooling device 300 coupled to EMI filter 104. As discussed below, in some embodiments, cooling device 300 is configured to surround and house EMI filter 104. As further discussed below, a cooling fluid may be pumped and/or cycled through cooling device 300 by pump mechanism 150 in system 100. In various embodiments, pump mechanism 150 may comprise a boiling fluid reservoir with significant head pressure, such as a cryostat or a condenser pump that compresses and cools gas to a liquid state. In some embodiments, pump mechanism 150 may comprise a hydrostatic pressure head. In some embodiments, pump mechanism 150 may comprise any other pumping technique that builds enough pressure in the coolant line to increase the coolant velocity sufficiently to maintain two state flow of liquid and gas throughout the device during operation.

Figure 2B:
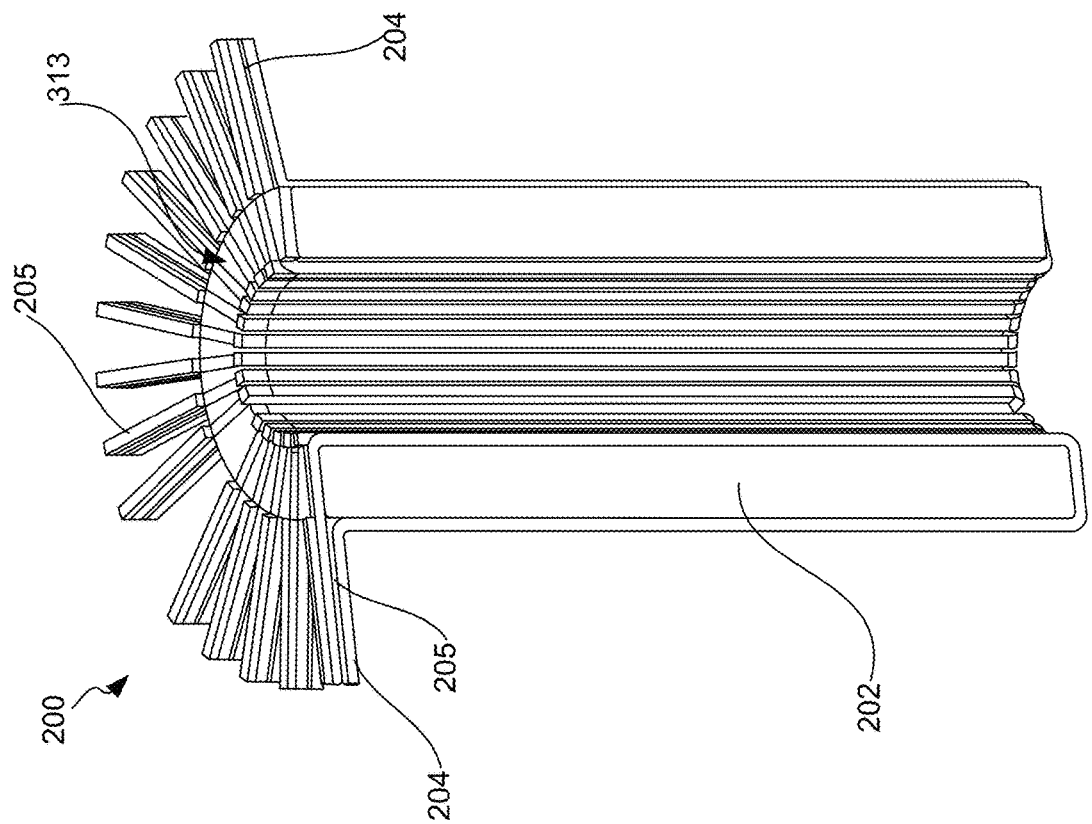
FIGS. 2A and 2B illustrate an example of an EMI filter, in accordance with one or more embodiments.
Figure 2A:
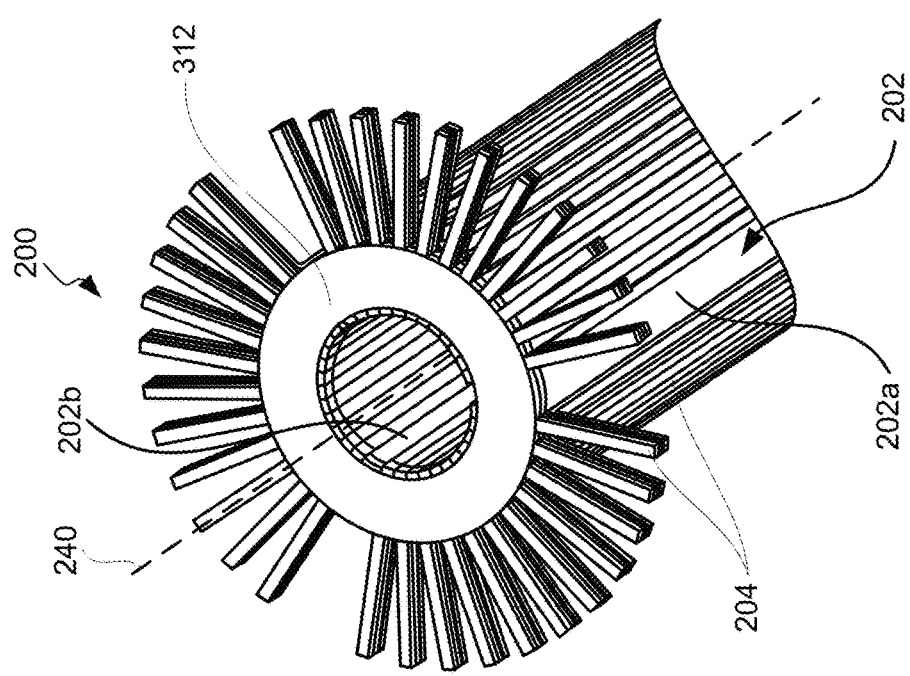

FIGS. 2A and 2B are detailed views of an EMI filter 200, in accordance with one or more embodiments. As previously described, EMI filter 200 may be EMI filter 104 and may include one or more inductors, such as inductor 106. FIG. 2B illustrates a cross-sectional view of EMI filter 200.

In some embodiments, EMI filter 200 comprises magnetic core 202, which may be a low loss nanocrystalline magnetic core, such as that manufactured by VITROPERM. In some embodiments, magnetic core 202 may be a ceramic magnetic toroid comprised of iron nanoparticles. As depicted in FIGS. 2A and 2B, magnetic core 202 may be shaped as a right circular, open cylinder with a hole centered around the longitudinal axis perpendicular to its base. Such magnetic core 202 can optimize coercivity and induction at 2 KHz switching frequencies over a temperature range of −100° C. to 50° C. while minimizing thermal losses from magnetic coupling to the induction circuit. Core 202 comprises an exterior surface 202a and an interior surface 202b, which defines the empty space at the center of the toroid.

In some embodiments, EMI filter 200 further comprises a multi-segmented conductive wire 204. In various embodiments, wire segments 204 may comprise of solid copper and/or silver. For example, multiple thin sheets (<0.1 mm thick) of copper or other metal may be stacked on top of one another. In some embodiments, wire segments 204 may comprise braided copper (Litz wire) or braided silver. In some embodiments, wire segments 204 are symmetrically wrapped azimuthally around the toroid to improve magnetic efficiency and reduce magnetic induction loss. In some embodiments, wire segments 204 are arranged into one or more groupings that are symmetrically disposed around the toroidal core 202. In some embodiments, wire insulation 205 may be included to maintain separation and/or positioning of wire segments 204. Wire insulation 205 may comprise fluorinated polymer, vinyl, polyethylene, or various electric potting material, such as rubber, silicone, epoxy, etc. In some embodiments, wire segments 204 as depicted in FIG. 2A, EMI filter 200 comprises a three phase AC choke including three groupings of wire 204 comprising eleven wire segments each. In some embodiments, such EMI filter 200 may be an alternating current common mode (AC-CM) choke. As depicted in FIG. 2B, each full grouping of wire 204 comprises nine wire segments. In various embodiments, EMI filter 200 may include any number of groupings of wire segments 204 which may comprise any number of wire segments 204. In some embodiments EMI filter 200 may be a direct current common mode (DC-CM) choke.

As further depicted in FIGS. 2A and 2B, at one end of the core 202, each wire segment 204 includes a portion that protrudes away from the center of the magnetic core 202 along an axis that is perpendicular to the longitudinal axis 240 of EMI filter 200.

In some embodiments, each grouping may include different numbers of wire segments. In some embodiments, each grouping of wire 204 forms the basis of an inductor, such as inductor 106. In some embodiments, wire segments may comprise either solid wire or Litz wire with individual wire diameters below 50 um to optimize dV/dt losses at 30 KHz switching frequencies required for the electronic circuit.

In some embodiments, EMI filter 200 further comprises a ring groove 313 configured to receive core sealing ring 312. In various embodiments, core sealing ring 312 assists with sealing core 202 and wire segments 204 with potting compound into the main housing such that in a completely assembled cooling device 300 the cryogenic coolant, or other cooling fluid, does not have direct access to the electrical wire segments 204. Core sealing ring 312 is a functional aspect of the present design but not necessarily a requirement for the design to function.

Electrically connecting the individual wire segments 204 may provide enough cross sectional area to pass 1000 Amps across the one or more inductors 106 without melting the surrounding insulation or heating the magnetic core 202 more than 40° C. above room temperature. In some embodiments, magnetic losses within the torpid may begin to have a significant effect on filter performance when cooled below negative 130° C. Furthermore, is widely understood that excessive cooling of magnetic materials also leads to increased coupling losses within magnetic circuits. While room temperature operation is often achieved for low power inductors, a MW EMI filter may generate between 300 and 800 Watts of thermal power loss across a single magnetic choke. To account for this heat load, a series of cryogenic EMI filter housings, further described in the present application, may be utilized to absorb the heat generated by current passing through the inductor and maintain a viable working temperature within the magnetic core.

Figure 3A:
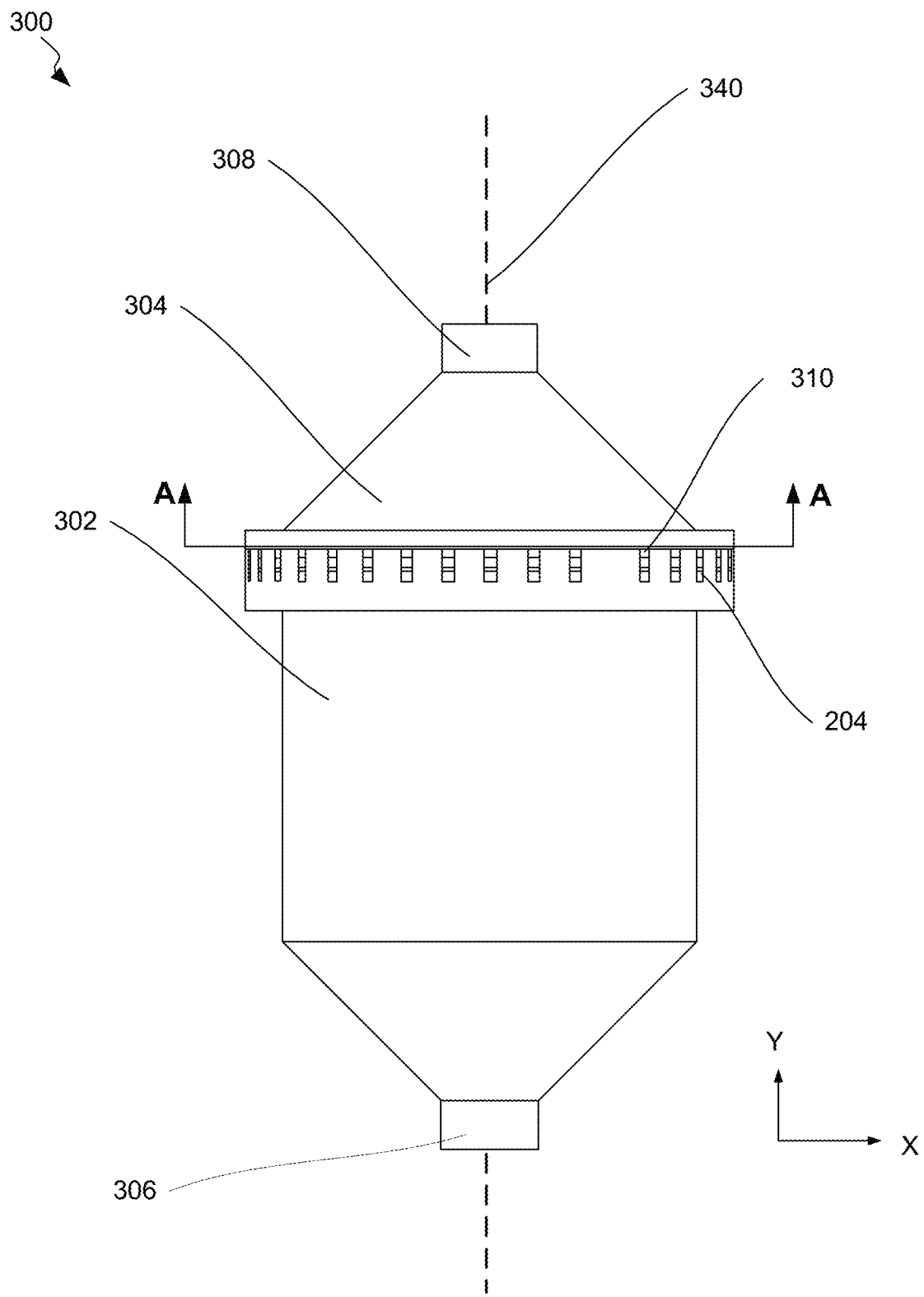
FIG. 3A is illustrates an example of a cooling device, in accordance with one or more embodiments.

FIG. 3A illustrates an example of a cooling device 300, in accordance with one or more embodiments. The cooling device 300 illustrated in FIGS. 3A-3C may be configured to house an EMI filter 200 as described in FIGS. 2A-2B. In some embodiments, cooling device 300 comprises housing with a base portion 302 and a cap portion 304 centered around a vertical longitudinal axis 340. The base portion 302 includes intake port 306 and cap portion 304 includes output port 308. In some embodiments, cooling device 300 further comprises horizontal wire grooves 310 for housing individual segments of wire 204.

In various embodiments, cooling device 300 may be constructed by additive manufacturing, such as selective laser sintering, stereolithography, fused deposition modeling, or other 3D printing process. Additive manufacturing such as fused deposition modeling allows for creation of 3D parts using thermoplastic polymers such as ABS, PC, PLA, Nylon, ULTEM, PEKK, and PEEK. In other embodiments cooling device 300 may be constructed by traditional machining methods, including turning, milling, drilling, grinding, etc. Non-traditional machining methods may also be implemented, such as, micro-machining, water jet cutting, electrochemical machining (ECM), abrasive flow machining (AFM), ultrasonic machining (USM), injection molding, polymer welding, etc. In various embodiments, housing of cooling device 300 may be constructed from various materials, such as thermoplastics, metals, and/or combinations thereof. In some embodiments, the thermoplastic material may be polyether ether ketone (PEEK). In other embodiments, the housing may comprise other thermoplastics, such as PEEK with carbon fiber, polyetherketoneketone PEKK, other thermoplastics in the polyaryletherketone (PAEK) family, other polyetherimide (PEI) resins such as polyetherimide (ULTEM), or glass-based epoxy resins, such as garolite (G-10). Other suitable materials may include nylon, acrylonitrile butadiene styrene (ABS), polycarbonate, alumina, polysulfone, other fiberglass composites, etc. Such materials may be selected for qualities including heat resistance, chemical resistance, and ability to withstand mechanical loads. In some embodiments, cooling device 300 is constructed to include various cavities and/or grooves in order to house and encapsulate EMI filter 200 as described with reference to FIGS. 3B-3D below.

Because the vast majority of thermoplastic printable materials become brittle below negative 40° C., and because the flammability of most polymers increases in the presence of liquid oxygen, several polymers may be more successfully implemented for the methods and apparatus described herein. For example, nylon is a cryogenically acceptable material to print with a dielectric strength of 25 kV/mm. However, mechanical properties of printed nylon degrade at liquid nitrogen temperatures, significantly increasing the risk of part failure. ULTEM is also mechanically viable and chemically resistant, however, ULTEM demonstrates about ½ of the thermal conductivity and just under ½ of the dielectric strength of both nylon and PEEK. PEEK is both chemically resistant and maintains a dielectric strength of 23 kV/mm. A number of common fiberglass and ceramic materials that are also often used in cryogenic applications. For example, RTC-60 cast alumina possesses proven cryogenic behavior and G10 fiberglass has been considered for its excellent and very well understood cryogenic properties.

Figure 3C:
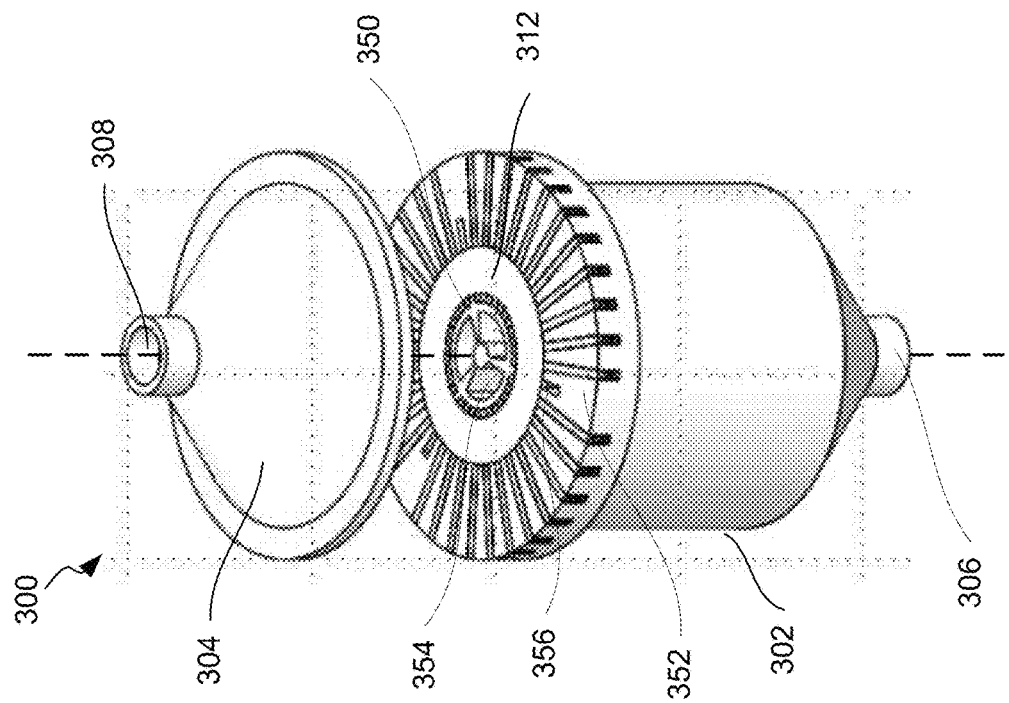
Figure 3B:
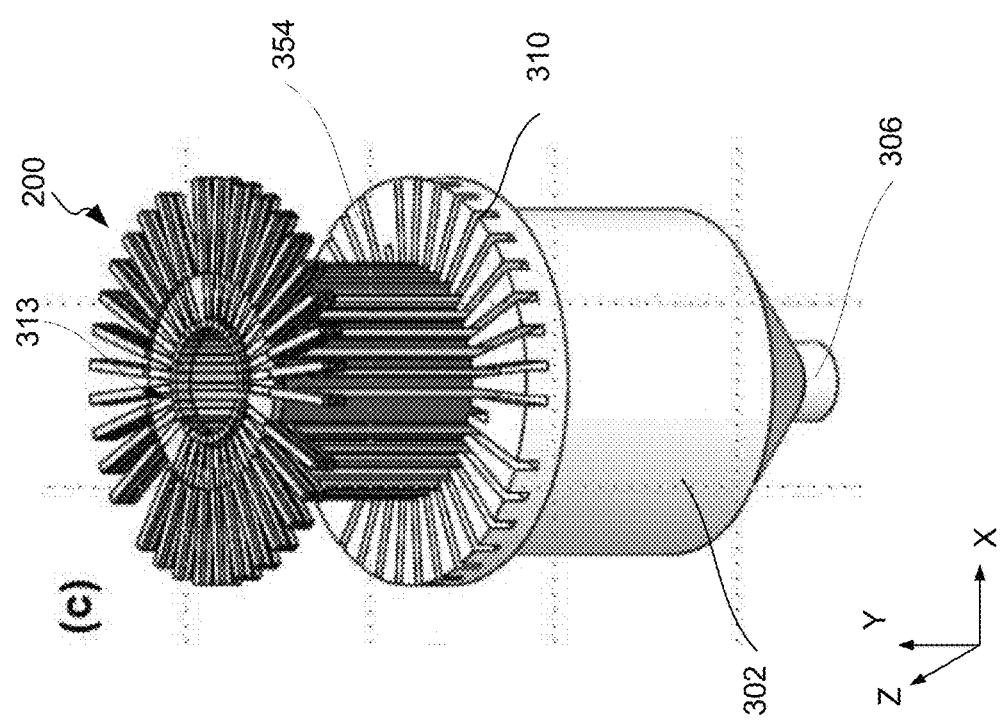

FIGS. 3B-3D are schematic diagrams of a housing of a cooling device, in accordance with one or more embodiments. As previously described, the housing of cooling device is configured to house and enclose EMI filter 200, which can be inserted into base portion 302. FIG. 3B depicts an angled view of the base portion 302 of cooling device 300 with an EMI filter 200 partially inserted. FIG. 3C depicts an angled view of cooling device 300 with EMI filter 200 completely inserted. As shown in FIG. 3C, when EMI filter 200 is completely inserted, each segment of wire 204 are positioned within a horizontal wire groove 310. It can be seen in FIG. 3C that base portion 302 of cooling device 300 comprises a central structure 350 and peripheral structure 352. Central structure 350 includes three central flow channels 354 and is positioned through the central hole of EMI filter 200. Peripheral structure 354 includes three peripheral flow channels 356, each of which are positioned along exterior surface 202a of the toroidal core 302 and in between groupings of segments of wire 204.

Core sealing ring 312 is secured into ring groove 313. Cap portion 304 may then be positioned to enclose EMI filter 200 within the structure of cooling device 300 as shown in FIG. 3C. Cap portion 304 may be attached to base portion 302 by glue, adhesive, and/or by welding processes. Plastic welding may be implemented for housings constructed of thermoplastic material, while housings machined from metals may be welded by shield metal arc welding, gas tungsten arc welding, gas metal arc welding, flux-cored arc welding, submerged arc welding, electroslag welding, or other known welding processes. In some embodiments, base portion 302 and cap portion 304 of the housing comprise a monolithic structure after it is attached to base portion 302.

FIG. 3D illustrates a more detailed view of the base portion 302 of the housing of cooling device 300. As previously described, the base portion 302 is configured to house and enclose EMI filter 200 which may be inserted into main cavity 380, such as depicted in FIGS. 3B and 3C. In some embodiments, main cavity 380 is formed by central structure 350 and peripheral structure 352.

Central structure 350 is located to the center of main cavity 380. As depicted in FIG. 3D, central structure 350 comprises three central flow channels 354 running along the length of central structure 350 and into the intake port 306 (shown in FIGS. 4A-4E). In some embodiments, central structure 350 may comprise more or less central flow channels 354. In some embodiments, the number of central flow channels 354 corresponds to the number of groupings of segments of wire 204. In some embodiments, each central flow channel 354 is positioned adjacent to a grouping of segments of wire 204. In some embodiments, central flow channels 354 are disposed symmetrically around a longitudinal axis 340 of cooling device 300.

Base portion 302 may further comprise wire grooves configured to house individual segments of wire 204. Horizontal wire grooves 310 are positioned along the face of peripheral structure 352. Within main cavity 380, outer vertical wire grooves 314 run along the peripheral structure 352. Internal vertical wire grooves 316 run along central structure 350 within main cavity 380. A set of wire grooves may comprise one of each groove: horizontal wire groove 310, outer vertical wire groove 314, and internal vertical wire groove 316. Each set of wire grooves may correspond to a wire segment 204. As such, wire grooves 310, 314, and 316 may be disposed into groupings that coincide with the groupings of wire segments 204. For example, the base portion 302 shown in FIG. 3D includes three groupings of eleven sets of wire grooves that correspond to the position of the three groupings of eleven wire segments 204 of EMI filter 200 depicted in FIG. 2A. Such grooves maintain separation of wire segments 204, reduce air gaps, maintain geometric precision during assembly, and provide direct thermal contact of the cooling fluid to the magnetic core 202. In some embodiments, a tight but usable fit between the EMI filter 200 and base portion 202 components spreads a thin layer of cryogenic potting material between the two structures, preventing air from being trapped inside and subsequently freezing during operation. In some embodiments, horizontal grooves 310 are opened to the outside edges, and provide a means to connect the inductor coils to the remainder of the converter circuit in system 100.

As further depicted in FIG. 3D, peripheral structure 352 of base portion 302 comprises three peripheral flow channels 356 running along the length of central structure 350 and into the intake port 306 (shown in FIGS. 4A-4E). In some embodiments, central structure 350 may comprise more or less peripheral flow channels 356. In some embodiments, the number of peripheral flow channels 356 corresponds to the number of groupings of segments of wire 204. In some embodiments, peripheral flow channels 356 are disposed symmetrically around longitudinal axis 340 of cooling device 300. In some embodiments, peripheral flow channels 356 are positioned to protrude between groupings of the groupings of wire segments 204. For example, the three peripheral flow channels 356 in FIG. 3D are disposed between the three groupings of wire grooves previously described. In some embodiments, central flow channels 304 are symmetrically offset around longitudinal axis 340 relative the peripheral flow channels 306, as shown in FIG. 3D.

In some embodiments, peripheral flow channels 356 are fully enclosed spaces. In other embodiments, peripheral flow channels 356 include a surface that is open toward main cavity 380, as shown in FIG. 3D. In some embodiments, core 202 of EMI filter 200 may contact the edges of peripheral flow channels 354 when inserted into main cavity 380 such that core 202 forms a surface for each peripheral flow channel 354 to seal the interior of each peripheral flow channel 354 (further shown in FIG. 4B).

Figure 3E:
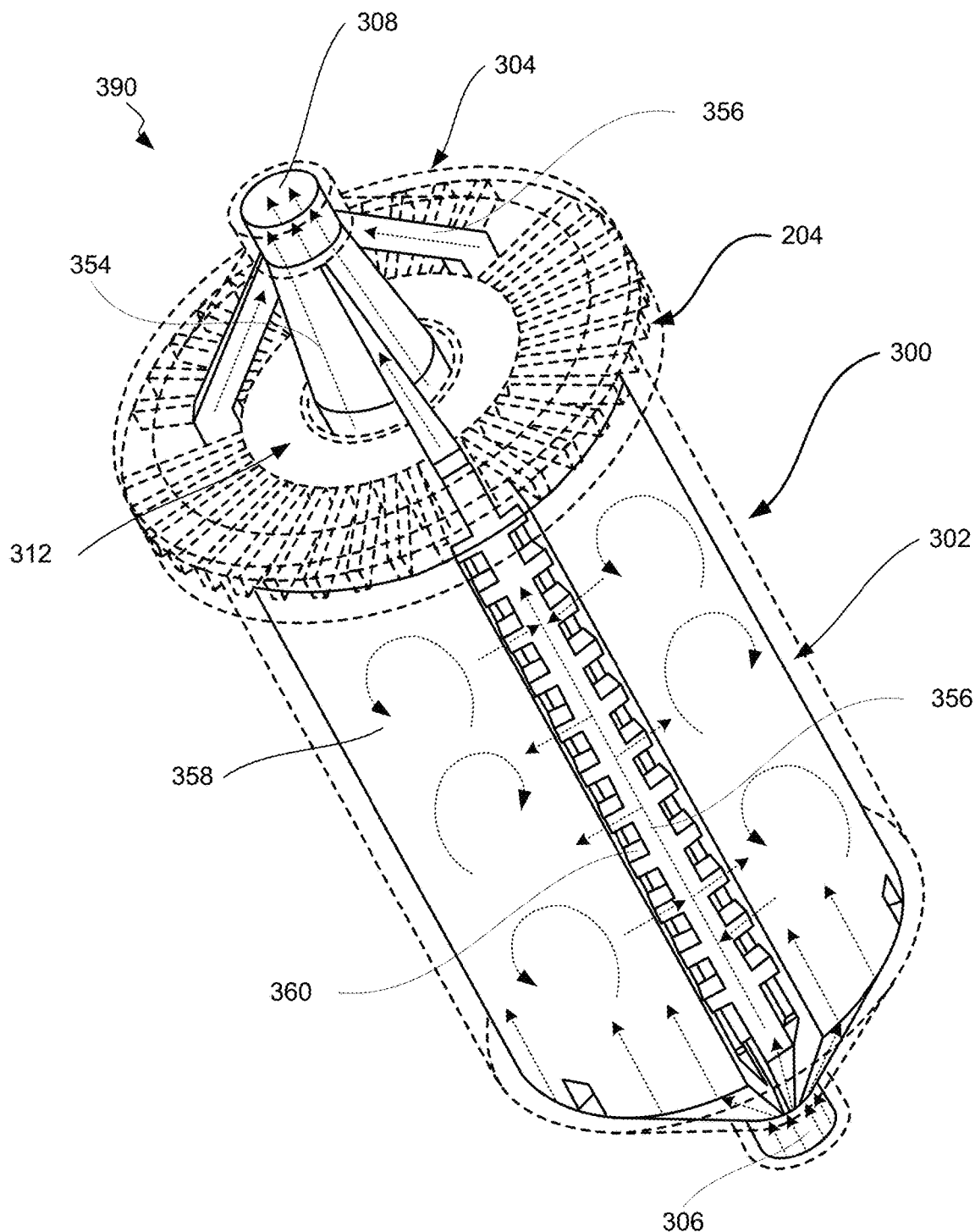
FIG. 3E illustrates an example of the liquid filled areas formed by interconnected flow channels and chambers of a cooling device with a fully encapsulated EMI filter, in accordance with one or more embodiments.

FIG. 3E illustrates an example of liquid filled areas 390 formed by interconnected flow channels and exterior chambers of a cooling device 300 with a fully encapsulated EMI filter 200, in accordance with one or more embodiments. As depicted in FIG. 3E, various components of cooling device 300 and EMI filter 200 are shown in dashed lines, including the base portion 302 and cap portion 304, core sealing ring 312, and wire segments 204.

As further depicted in FIG. 3E, the liquid filled areas 390 are shown, including the areas within central flow channel 354, peripheral flow channels 356, and exterior chamber 358. In various embodiments, the liquid is pumped through these areas 390 by pump 150. In some embodiments, the liquid comprises a cryogenic fluid, such as liquid nitrogen. In other embodiments, the liquid may comprise a cooled hydrocarbon fuel. In some embodiments, the one or more central flow channels 354, the peripheral flow channels 356, and the exterior chambers 358 of areas 390 are interconnected, as shown in FIG. 3E.

Dotted arrows in FIG. 3E indicate the direction of flow of the pumped fluid. As shown, the cooling fluid is pumped into the cooling device through intake port 306, where it enters into central flow channel 354. In some embodiments, the fluid may also flow directly into peripheral flow channels 356 and exterior chambers 358 from the intake port 306. In other embodiments, the peripheral flow channels 356 and/or exterior chambers 358 may branch out from the central flow channel 354. In some embodiments, the liquid may flow into exterior chambers 358 from the lateral flow channels 360 of the peripheral flow channels 356, as depicted in FIG. 3E. As further shown in FIG. 3E, the fluid may have a turbulent flow through each exterior chamber 358, as depicted by the curved dotted arrows. The cooling fluid may eventually flow back into peripheral flow channels 356 through the lateral flow channels 360. The flow of cooling liquid within the exterior chambers 358 depicted in FIG. 3E is one example. In various embodiments, such flow of liquid through exterior chambers 358 may vary based on how the liquid is flowed into the exterior chambers 358, such as the positioning of lateral flow channels 360.

In some embodiments, cap portion 304 may include portions of central flow channel 354 and peripheral flow channels 356. The cooling liquid may continue to flow through central flow channel 354 and peripheral flow channels 356 up into the respective portions in cap portion 304. In some embodiments, the cooling liquid may flow from central flow channel 354 and peripheral flow channels 356 directly into output port 308. In some embodiments, peripheral flow channels 356 may branch into the central flow channel 354 before exiting through output port 308. In some embodiments, the cooling liquid exits from output port 308 into system 100. In some embodiments, the cooling liquid may be cycled through system 100 and eventually reenter cooling device 300 through intake port 306.

Figure 4C:
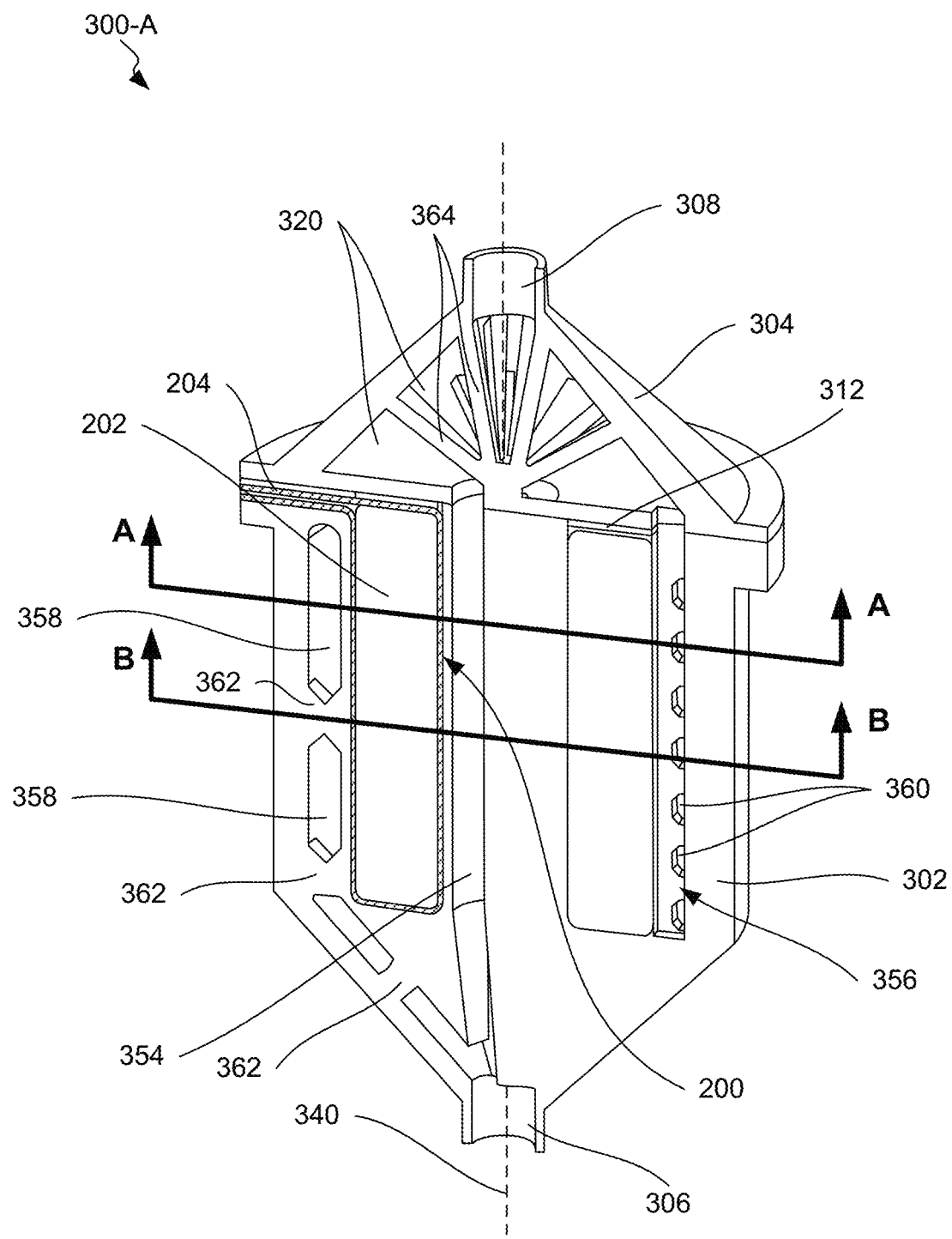

FIGS. 4A-4E are schematic cross-sectional views of various cooling devices, in accordance with one or more embodiments. FIGS. 4A and 4B depict a cooling device 300 housing an EMI filter 200 with 3 groupings of thirteen wire segments 204 each. As described in FIGS. 2A-2B, EMI filter 200 in FIGS. 4A-4B may comprise an alternating current common mode (AC-CM) choke or a direct current common mode (DC-CM) choke. The cross-sectional view of cooling device 300 in FIG. 4A depicts central flow channels 354 extending the length of central structure 350 of base portion 302. As previously described, cap portion 304 may also include portions of central flow channels 354 and/or peripheral flow channels 356. As shown in FIG. 4A, cap portion 304 includes portions of the two visible central flow channels 354. Thus, the central flow channels extend and allow flow from the intake port 306 to output port 308. The central flow channels are disposed symmetrically around longitudinal axis 340 and adjacently correspond to the groupings of wire segments 204.

Peripheral flow channels 356 can also be seen in FIGS. 4A and 4B. As previously described, in some embodiments, peripheral flow channels 356 may branch from central flow channels 354. Peripheral flow channels 356 extend the length of peripheral structure 352 of base portion 302, and portions of peripheral flow channels 356 may extend into cap portion 304, as previously described (not shown in FIGS. 4A and 4B). Peripheral flow channels 356 are disposed symmetrically around longitudinal axis 340 in between groupings of the wire segments 204.

In some embodiments, the electromagnetic induction filter 200 is disposed within the cavity 380 such that the magnetic core 202 seals the peripheral flow channels 356, as previously described with reference to FIG. 3D. As shown in FIG. 4B, the magnetic core forms a surface of peripheral flow channel 356. In some embodiments, the electromagnetic induction filter 200 may additionally and/or alternatively be disposed within the cavity 380 such that the magnetic core 202 seals one or more of the one or more central flow channels 354. As shown in FIG. 4B, cooling device includes other central flow channels 354a that are disposed in between groupings of wire segments 204. The interior of these central flow channels 354a may be opened to the central cavity 380. Magnetic core 202 may act as a sealing surface to close off the interior of these central flow channels 354a. In this way, cooling fluid that is pumped through the interconnected channels may make contact with the magnetic core 202 at these areas. Furthermore, wire segments 204 are physically separated from an interior of each of the central flow channels 354 and/or peripheral flow channels 356. The configuration of flow channels relative to the EMI filter 200 may be further discussed with reference to FIGS. 6A-6H.

Exterior chambers 358 are shown disposed within peripheral structure 352. Exterior chambers 358 are shown to be disposed symmetrically around longitudinal axis 340 and adjacently correspond to groupings of wire segments 204. Cooling liquid may or may not flow directly into exterior chambers 358. As previously described the liquid may flow into and/or out of exterior chambers 358 from peripheral flow channels 356 through lateral flow channels 360 (not shown). As can also be seen in FIG. 4A, in some embodiments, channel support structures 362 may be interspersed between fluid passageways leading into exterior chambers 368. In some embodiments, such channel support structures 362 are included to strengthen double walled areas, such as an exterior chamber 358.

FIG. 4C is a schematic cross-sectional view of another cooling device 300-A, in accordance with one or more embodiments. FIG. 4C depicts a cooling device 300 with one central flow channel 354 and a peripheral flow channel 356 including lateral flow channels 360 leading into one or more exterior chambers 358. Exterior chambers and/or other passageways may also include channel support structures 362 for added strength to such doubled walled areas. In some embodiments, peripheral flow channels may not branch directly from intake port 306 and/or central flow channel 354. Instead, in some embodiments, cooling fluid travels through central flow channels 354 and exterior chambers 358 from intake port 306. The fluid then travels into peripheral flow chambers 356 through lateral flow channels 360 and subsequently into portions of peripheral flow chambers 358 in cap portion 304 and/or collection chamber 320. Furthermore, in such described embodiments, only the cooling fluid flowing through peripheral flow channels 356 contact the magnetic core 202 of EMI filter 200 as previously described, such that the magnetic core 202 may be cooled by direct contact with the cryogenic fluid. In some embodiments, however, the majority of core cooling occurs though indirect contact with the cryogenic fluid. This in turn may mitigate volume expansion due to partial liquid-to-gas conversion of the cooling fluid as it is absorbs heat from the EMI filter 200. This direction of liquid flow is further illustrated in FIGS. 5B and 5C.

In FIG. 4C, cap portion 304 includes a collection chamber 320 of one or more cavities instead of portions of central flow channels 354 and/or peripheral flow channels 356. In some embodiments, collection chamber 320 includes chamber support structures 364 for added strength and/or support. In some embodiments, upper cavities of collection chamber 320 are interconnected with the central flow channels 354 and/or the peripheral flow channels 356. In some embodiments, central flow channels 354 and/or peripheral flow channels may flow directly into collection chamber 320. In some embodiments, the collection chamber 320 allows for expansion and collection of cooling fluid before exiting through output port 308. In some embodiments, the upper cavities of collection chamber 320 are disposed adjacently to the portions of each wire segments 204 protruding away from the center of the magnetic core 202 along an axis that is perpendicular to a longitudinal axis 240 and/or 340. This may provide further cooling capability for the EMI filter 200.

Cooling device 300-A shown in FIG. 4C may be a cooling device for an ACCM EMI filter 200 created by additive manufacturing methods, such as 3D printing or other fused deposition manufacturing. FIGS. 4D and 4E depict cross-sectional views of alternative embodiments of cooling devices 300-B and 300-C, respectively. FIG. 4I) depicts a cooling device 300-B which may comprise a cooling device for a DC-CM EMI filter 200 created through additive manufacturing methods. Use of additive manufacturing methods may provide for the creation of slotted grooves, such as grooves 310, 314, and/or 316. Such grooves maintain separation of wire segments 204, reduce air gaps, maintain geometric precision during assembly, and provide direct thermal contact of the cooling fluid to the magnetic core 202. Because EMI filter 200 in FIG. 4D, and consequently cooling device 300-B, is shorter in length, fewer, or no channel support structures 362 are needed to strengthen double walled areas.

Cooling device 300 is configured such that cooling fluid is pumped to enter cooling device 300 from intake port 306 and then into central flow channels 354 and exterior chambers 358. The cooling fluid in the central flow channels 354 get pumped into the collection chambers 320 within cap portion 304. Cooling fluid within central flow channels 354 may directly contact portions of magnetic core 202 in areas separated from wire segments 204. Cooling fluid within exterior chambers 358 may then flow through one or more lateral flow channels 360 into peripheral flow channels 356, and into collection chambers 320 within cap portion 304. Cooling fluid within collection chambers 320 may then exit cooling device 300-B through output port 308.

FIG. 4E depicts a cooling device 300-C, which may comprise a cooling device for an AC-CM EMI filter 200 created through traditional and/or non-traditional machining methods. For example, cooling device 300-C may include an exterior portion 302-A constructed from G-10, which includes cap portion 304 and an exterior portion of peripheral structure 352. Cooling device 300-C may also include an interior portion 302-B constructed from cast alumina dielectric material surrounding EMI filter 200, which includes central structure 350, interior portions of peripheral structure 352, and/or core sealing ring 312. For example the interior portion 302-B may be casted in a mold. The EMI filter 200 may then be slot fed into the alumina structure 302-B and be covered by a second piece of alumina. The alumina encased EMI filter 200 may then be slot fed into a G-10 barrel machined such that the fiberglass fibers extend along the azimuthal length of the cylinder. A G-10 cover piece may then be compression fit over the alumina structure. A compression ring may then be machined into both G-10 components which can then be clamped to prevent flow of cooling fluid from the seal of the housing.

Current machining methods may be more cost efficient, but may not precise enough to create wire grooves, such as grooves 310, 314, and/or 316. In other embodiments, the grooves may not be needed to provide direct contact between the core 202 and cooling fluid. In embodiments, where base portion 302 and cap portion 304 are machined using cast alumina and G-10 materials, the thermal conductivity of the cast alumina may be sufficient to cool the EMI filter 200 without direct contact with the cooling fluid. However, potting material, such as wire insulation 205, may be required to fill in gaps between wire segments 204 to provide separation of wire segments. In some embodiments, it may be desired to reduce the need for cryogenically compatible electrical potting material. As such, the slotted grooves discussed above and with reference to FIG. 3D may provide a more beneficial configuration.

As shown, cooling fluid may be pumped into cooling device 300-C from intake port 306 and into a single central flow channel 354 and a single exterior chamber 358 that is disposed around the entire peripheral structure 352 around longitudinal axis 340.

Figure 5B:
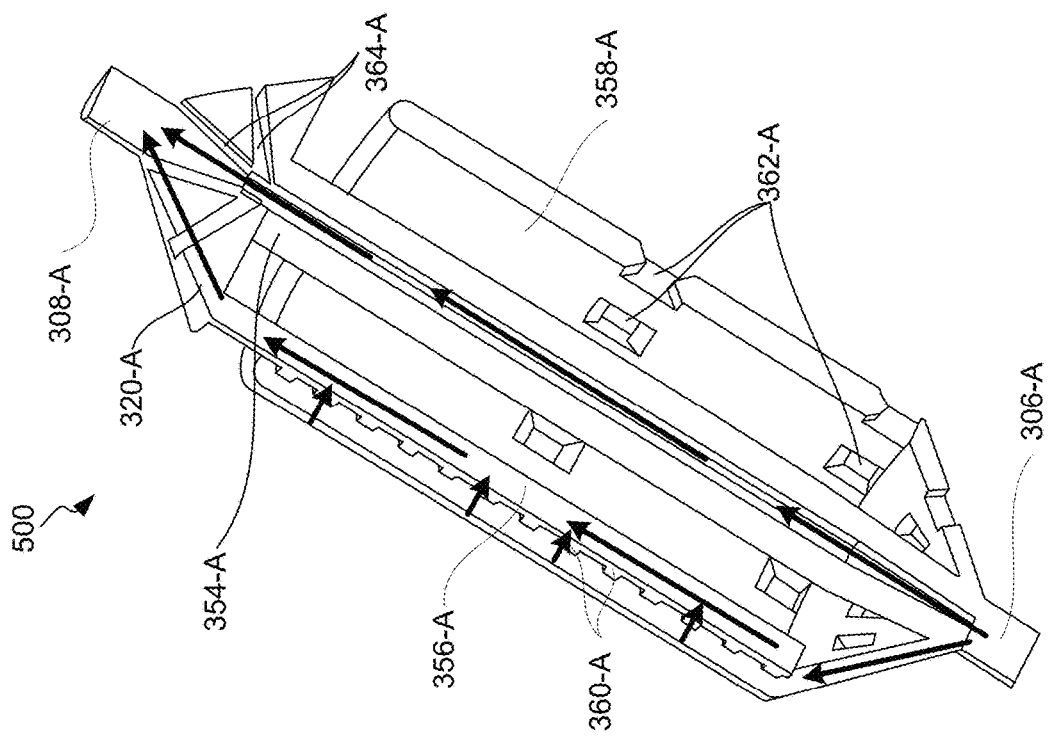
FIGS. 5A-5B are schematic diagrams of various configurations of negative space located within a housing of a cooling device, in accordance with one or more embodiments.
Figure 5A:
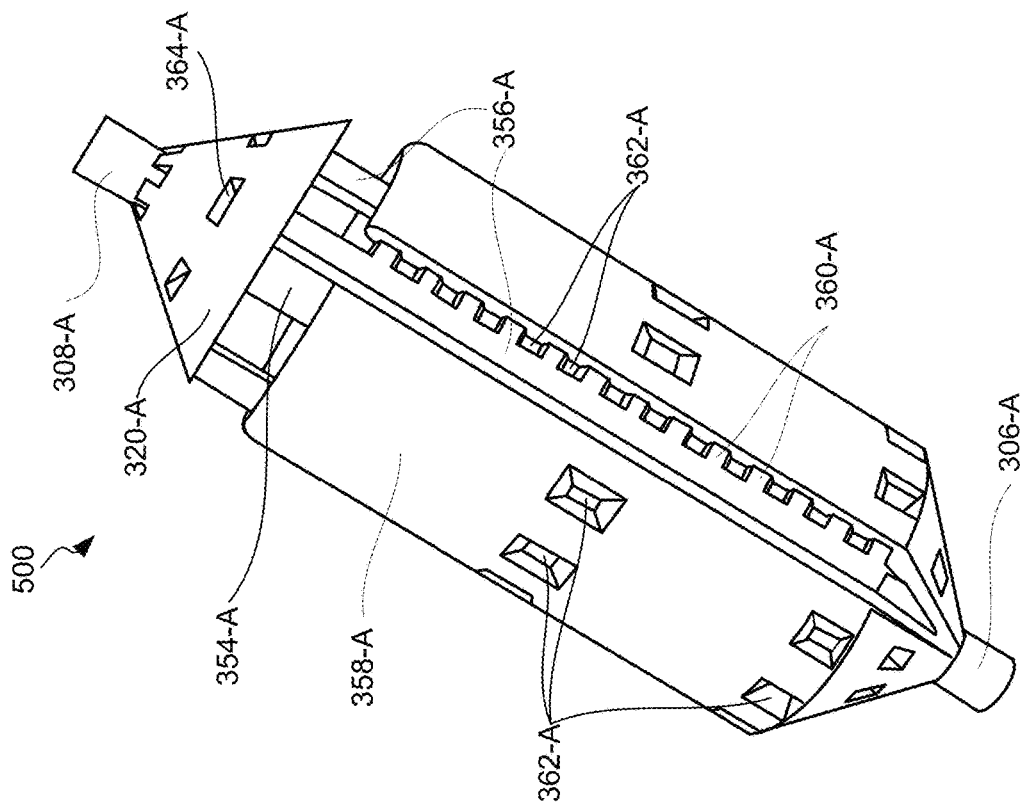

FIGS. 5A-5B are schematic diagrams of various configurations of negative space located within a housing of a cooling device 300, in accordance with one or more embodiments. FIG. 5A depicts a negative space 500. FIG. 5B is a cross-sectional view of negative space 500. In some embodiments, negative space 500 corresponds to the spaces within the various channels, chambers, and ports herein described and may be filled with pumped cooling fluid. In some embodiments, negative space 500 may correspond to liquid filled areas, such as area 390 in FIG. 3E. In some embodiments, negative space 500 may correspond to the negative space and/or fluid filled areas of cooling device 300-A, and/or other cooling device for an AC-CM choke EMI filter.

For ease and clarity of explanation, the spaces discussed in FIGS. 5A-5B will be referred to as the structure containing such space. For example, space 358-A will be referred to as exterior chamber 358-A because space 358-A corresponds to the negative space and/or fluid filled space within an exterior chamber 358, as in FIG. 4C for example. Arrows are shown in FIG. 5B to depict the flow direction of cooling fluid within the negative space 500.

As shown in FIGS. 5A-5B, the negative space 500 of a cooling device includes intake port 306-A. Cooling fluid may enter the cooling device through intake port 306-A and enter into center flow channels 354-A, as well as exterior chambers 358-A. From there, cooling fluid passing through central flow channel 354-A may continue into collection chamber 320-A within cap portion 304. Cooling fluid passing through exterior chambers 358-A may then continue into peripheral flow channels 356-A via lateral flow channels 360-A, which connect the exterior chambers 358-A to peripheral flow channels 356-A. Once in the peripheral flow channels 356-A, the cooling fluid may travel into collection chamber 320-A. As cooling fluid passes through spaces 354-A and 356-A, the cooling fluid may or may not make direct contact with the magnetic core 202 of EMI filter 200. As previously described, cooling chamber 320-A may provide space for expansion of the cooling fluid as it absorbs heat generated by the EMI filter 200 before it exits through output port 308-A. As such, it can be seen that the central flow channels 354, peripheral flow channels 356, exterior chambers 358, and collection chamber 320 are interconnected.

As further depicted in FIGS. 5A-5B, there are additional spaces throughout negative space 500 which correspond to the various support structures previously described. For example spaces 362-A correspond to lateral support structures 362 that provide added strength in double-walled areas. Spaces 362-A indicated the lateral support structures 362 exist all around the circumference of the cooling device around exterior chamber 358-A. Additional support structures may also separate the multiple lateral flow channels 360-A leading from exterior chamber 358-A to peripheral flow channels 356-A. Similarly, spaces 364-A indicated the location of chamber support structures 364 within collection chamber 320-A.

Figure 6A:
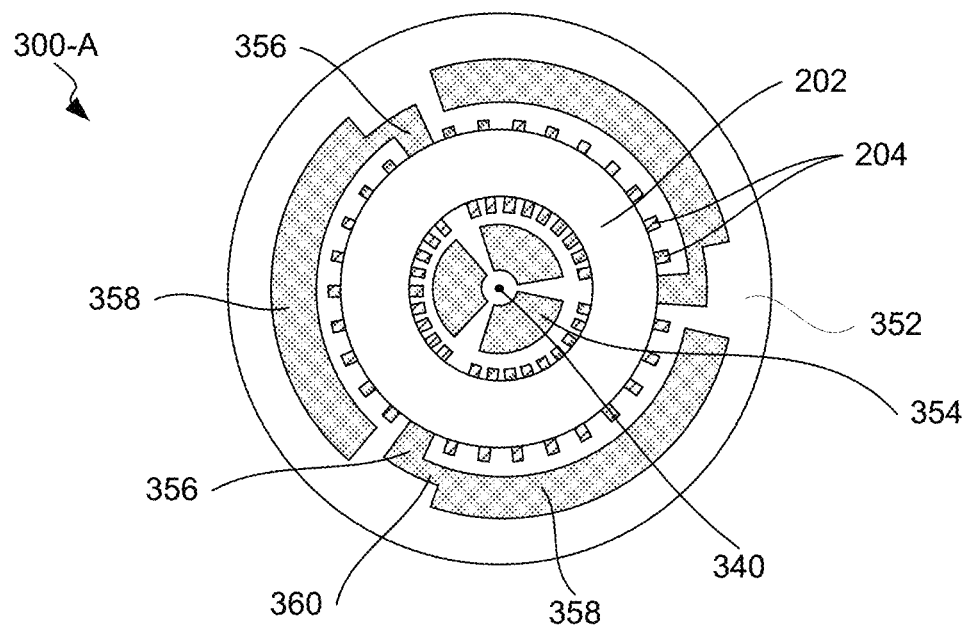
FIGS. 6A-6H are cross-sectional views depicting various configurations of central flow channels, peripheral flow channels, and exterior chambers, in accordance with one or more embodiments.
Figure 6B:
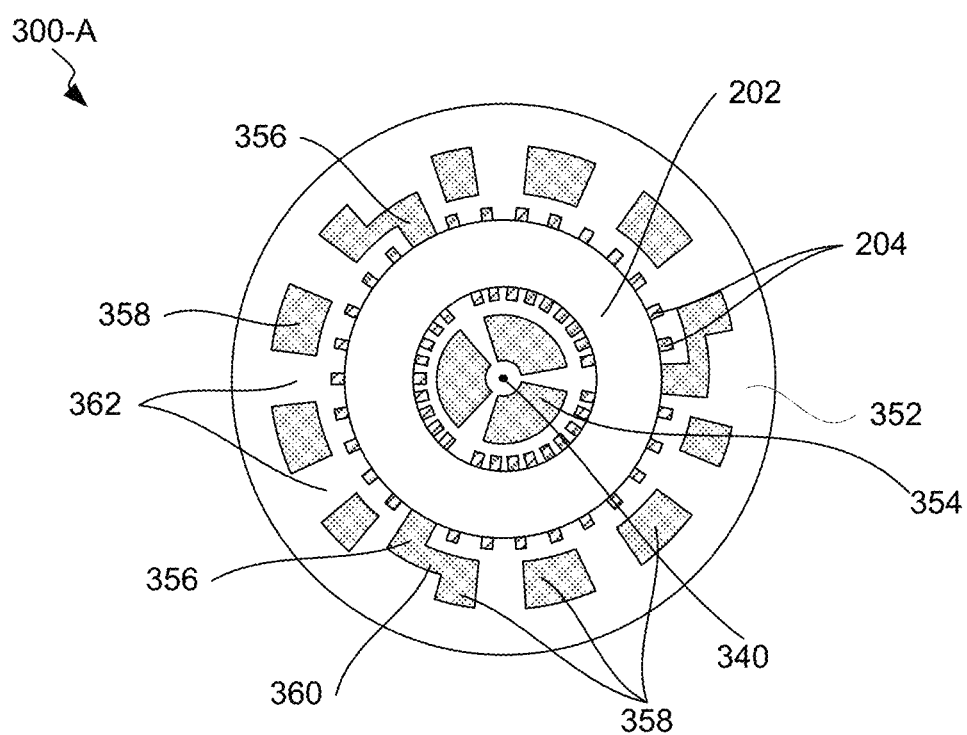

FIGS. 6A-6H are cross-sectional views depicting various configurations of central flow channels, peripheral flow channels, and exterior chambers, in accordance with one or more embodiments. FIGS. 6A-6B depict a cross-sectional view of cooling device 300-A, as described in FIG. 4C, FIG. 6A corresponds to a cross-section from the A-A viewpoint indicated in FIG. 4C. FIG. 6B corresponds to a cross-section from the B-B viewpoint indicated in FIG. 4C.

As shown, EMI filter 200 with core 202 and wire segments 204 is inserted within cooling device 300-A. There are three groupings of nine wire segments 204 each. Three peripheral flow channels 356 are disposed symmetrically around the longitudinal axis 340 located at the center of cooling device 300-A. The peripheral flow channels 356 are disposed in between the three groupings of wire segments 204. Furthermore, three central flow channels 354 are positioned within the center of the EMI filter 200 and are also disposed symmetrically around the longitudinal axis 340. As further depicted, in some embodiments, the central flow channels 354 are symmetrically offset around the longitudinal axis 340 relative to the peripheral flow channels 356. As such, the center flow channels 354 may be disposed to adjacently correspond to the position of the groupings of wire segments 204.

Exterior chambers 358 surround the exterior surface of EMI filter 200. Each exterior chamber 358 extends adjacently across a grouping of wire segments 204. The exterior chambers 358 are connected to peripheral flow channels 356 by lateral flow channels 360. In FIG. 6B, the lateral support structures 362 extending within exterior chambers 358 can be seen, which corresponds to the B-B arrow in FIG. 4C.

As previously described, the magnetic core 202 may be exposed to an interior of each of the central flow channels 354 and/or peripheral flow channels 356. Thus, the cooling fluid within central flow channels 354 and/or peripheral flow channels 356 may make direct contact with core 202 in various embodiments. As shown in FIGS. 6A-6B, peripheral flow channels 356 make direct contact with core 202 in cooling device 300-A. As can also be seen, the wire segments 204 do not make direct contact with any cooling fluid. The wire segments 204 are physically separated from the interior of each of the central flow channels 354, the peripheral flow channels 356, the exterior chambers 358, collecting chamber 320, and any other fluid filled space.

Figure 6C:
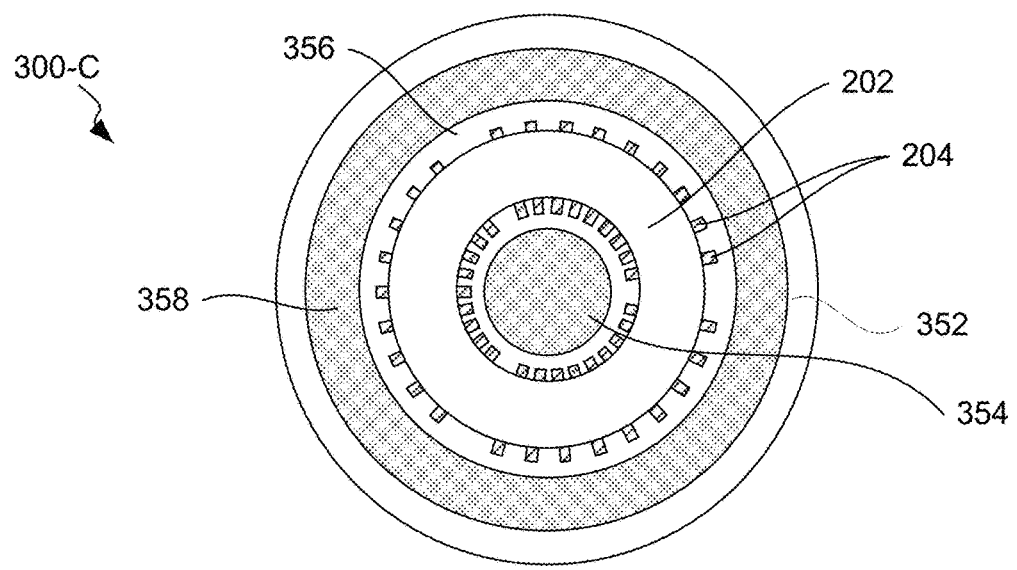
Figure 6D:
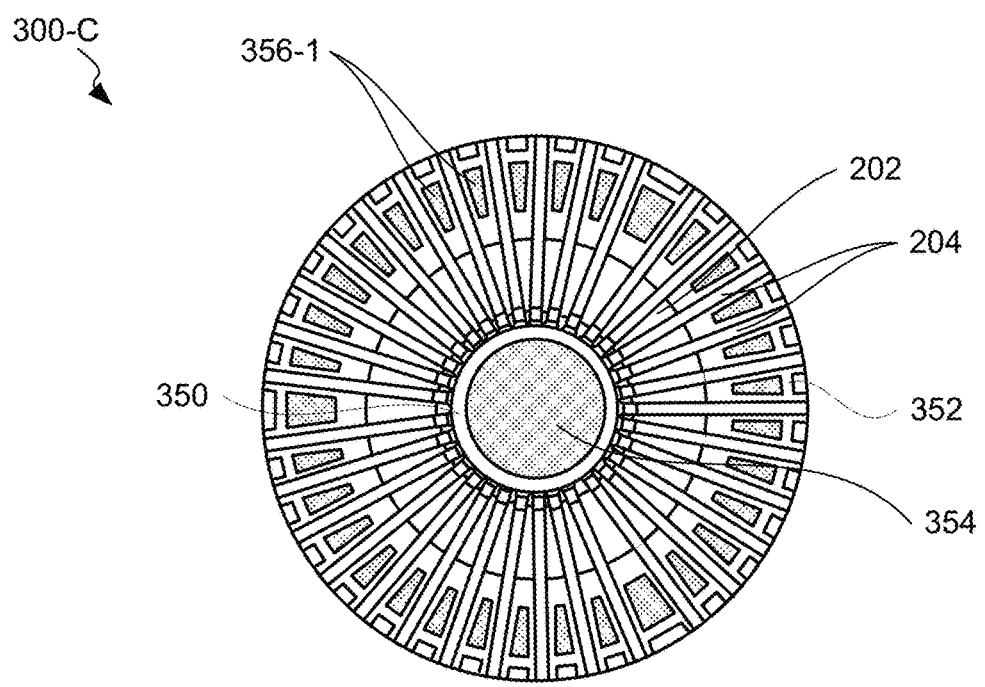
Figure 6E:
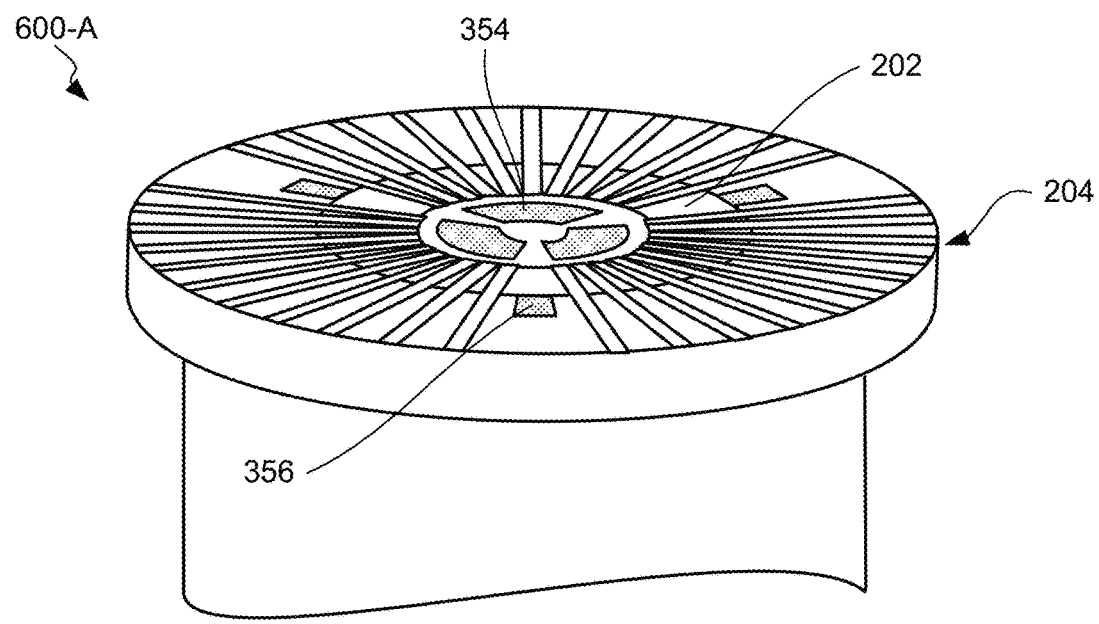

FIGS. 6C-6D depict a cross-sectional view of cooling device 300-C, as described in FIG. 4E. FIG. 6C corresponds to a cross-section from the A-A viewpoint indicated in FIG. 4E. As can be seen in FIG. 6C, as well as FIG. 4E, cooling device 300-C includes one central flow channel 354 extending through the center of EMI filter 200, and a single exterior chamber 358 surrounding the outer surface of EMI filter 200. As previously described, cooling device 300-C may be machined from a combination of alumina and G-10. These materials may provide sufficient strength to the structure without the need of lateral support structures, such as 320.

FIG. 6D corresponds to a cross-section from the B-B viewpoint indicated in FIG. 4E. The single central flow channel 354 is remains continuous throughout the cooling device 300-C. As shown, exterior chamber 358 may divide into several narrow peripheral flow channels 356-1, where each peripheral flow channel 356-1 is disposed of between each wire segment 204. The cooling fluid may pass through these narrow peripheral flow channels 356-1 into the collection chamber 320 as depicted in FIG. 4E. Such configuration of peripheral flow channels 356-1 may facilitate cooling of EMI filter 200.

FIGS. 6E-6H depict cross-sectional views from viewpoint A-A in FIG. 3A showing various other possible configurations of EMI filter 200 and flow channels for cooling devices. Cross-section 600-A in FIG. GE shows a cooling device with EMI filter 200 with three groupings of wire segments 204 around core 202, similar to the configuration depicted in FIG. 3C. Three peripheral flow channels 356 are symmetrically disposed in between each grouping of wire segments 204 at the exterior surface of core 202. Three central flow channels 354 are symmetrically disposed within the center of EMI filter 200 and are offset relative to the peripheral flow channels 356.

Figure 6F:
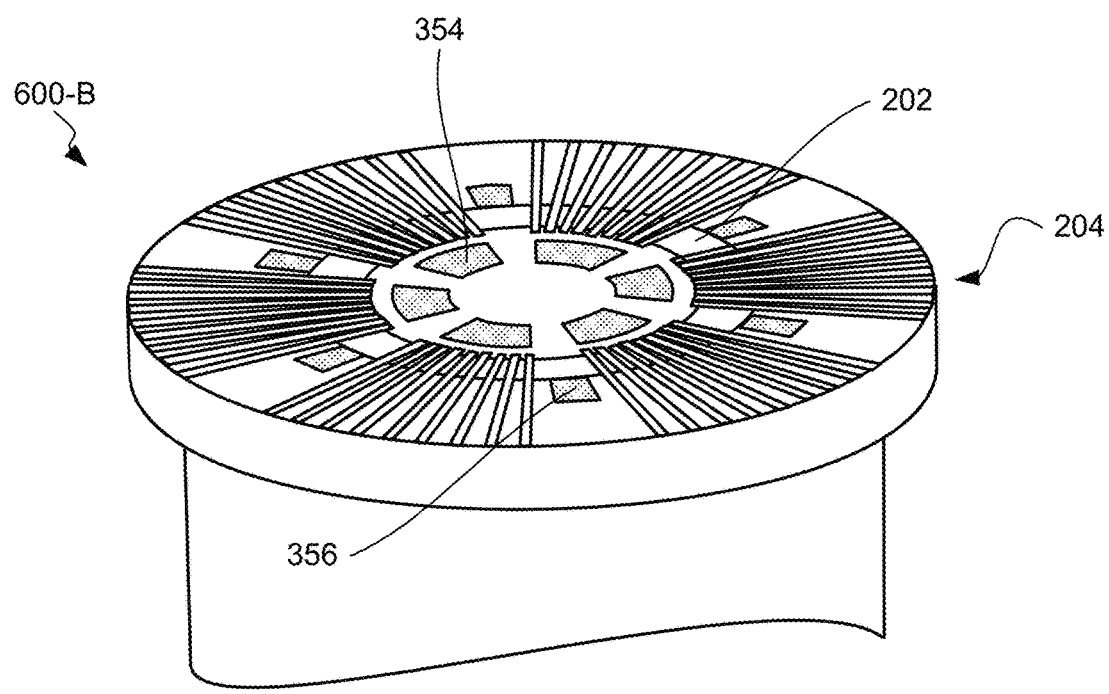

Cross-section 600-B in FIG. 6F shows a cooling device with EMI filter 200 with six groupings of wire segments 204 around core 202. Six peripheral flow channels 356 are symmetrically disposed in between each grouping of wire segments 204 at the exterior surface of core 202. Six central flow channels 354 are symmetrically disposed within the center of EMI filter 200 and are offset relative to the peripheral flow channels 356.

Figure 6G:
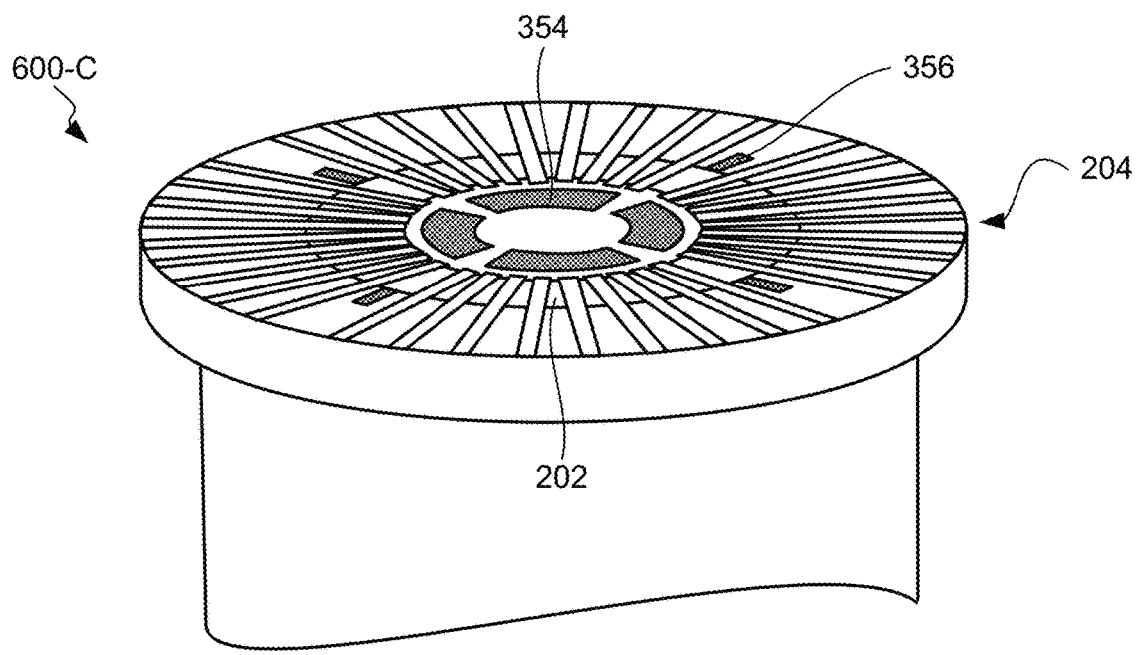
Figure 6H:
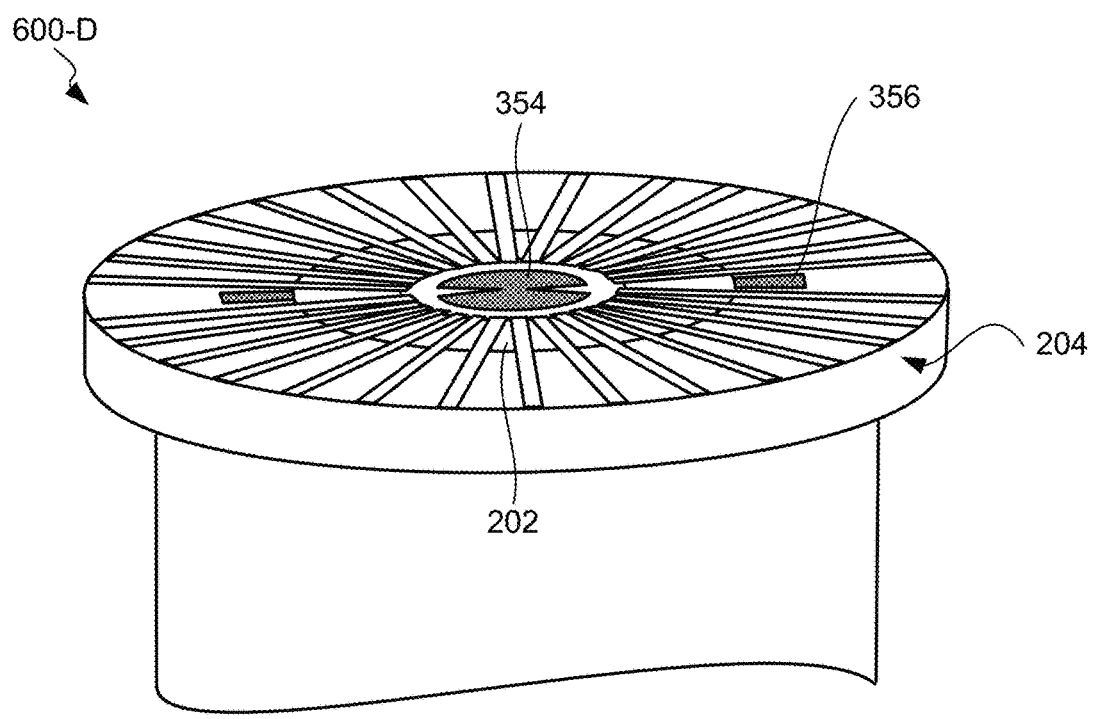

Cross-section 600-C in FIG. 6G shows a cooling device with EMI filter 200 with four groupings of wire segments 204 around core 202. Four peripheral flow channels 356 are symmetrically disposed in between each grouping of wire segments 204 at the exterior surface of core 202. Four central flow channels 354 are symmetrically disposed within the center of EMI filter 200 and are offset relative to the peripheral flow channels 356.

Cross-section 600-C in FIG. 6G shows a cooling device with EMI filter 200 with two groupings of wire segments 204 around core 202. Two peripheral flow channels 356 are symmetrically disposed in between each grouping of wire segments 204 at the exterior surface of core 202. Two central flow channels 354 are symmetrically disposed within the center of EMI filter 200 and are offset relative to the peripheral flow channels 356.

Figure 7A:
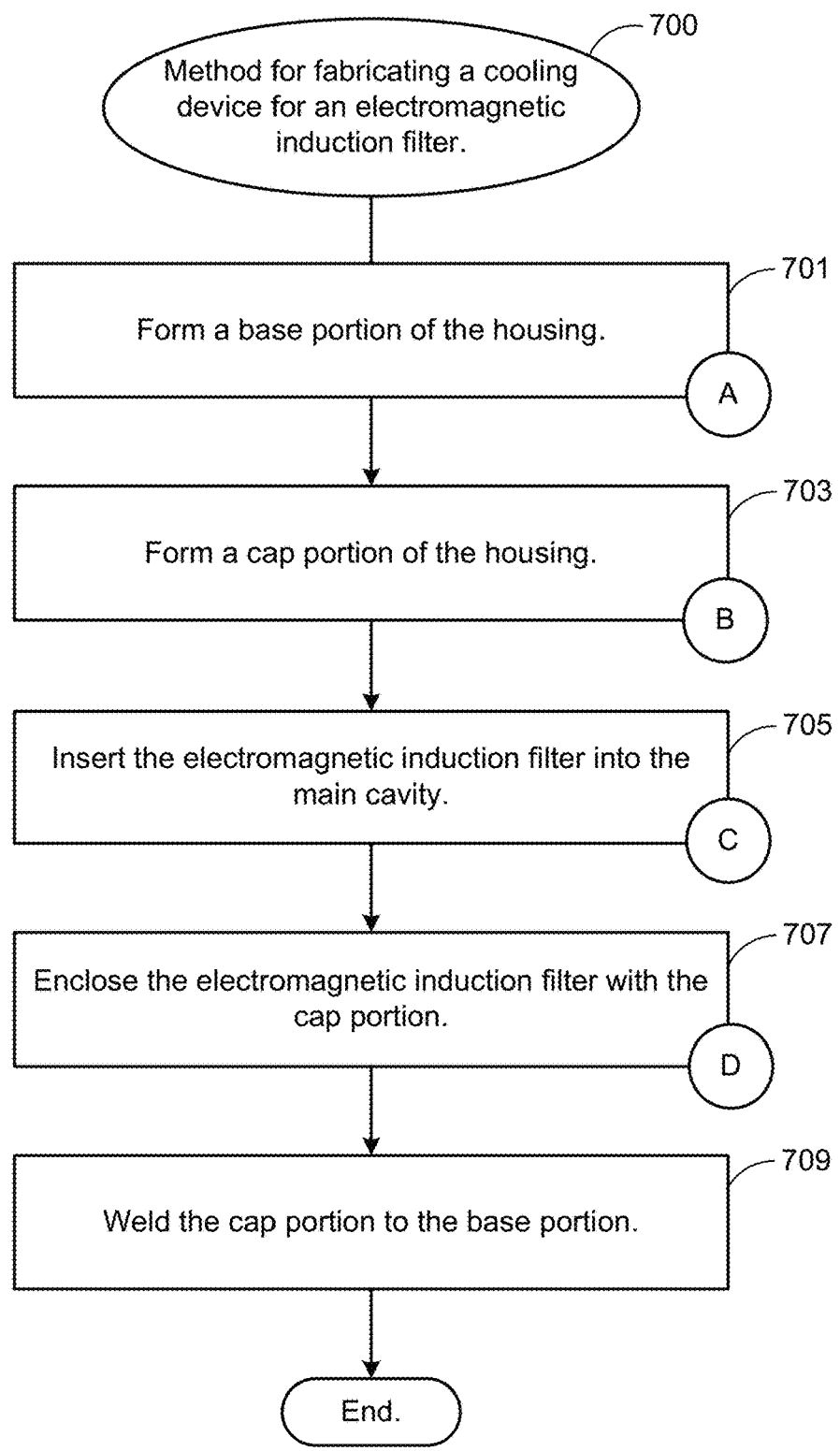
FIGS. 7A-7C illustrate an example method for fabricating a cooling device for an electromagnetic induction filter, in accordance with one or more embodiments.
Figure 7B:
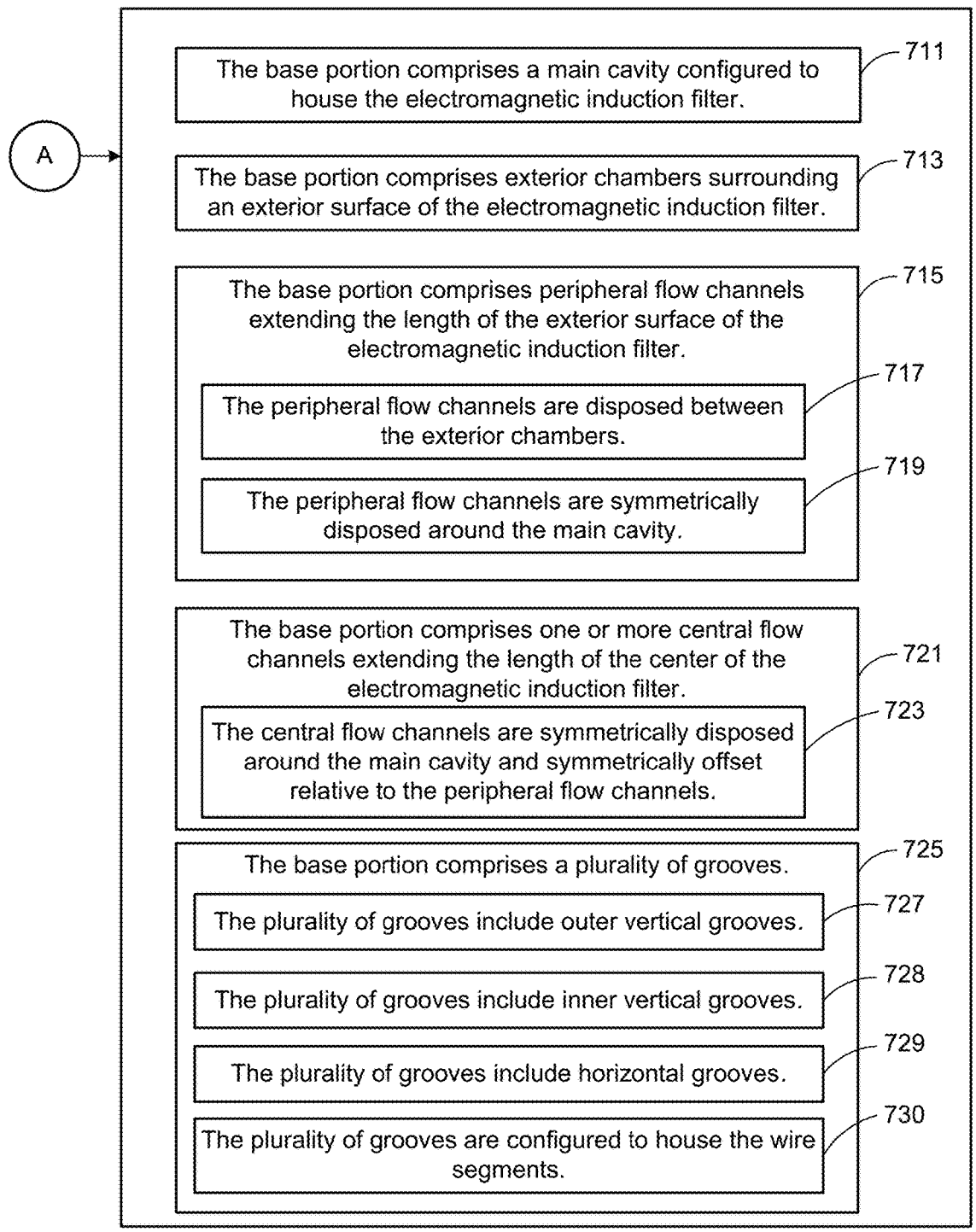
Figure 7C:
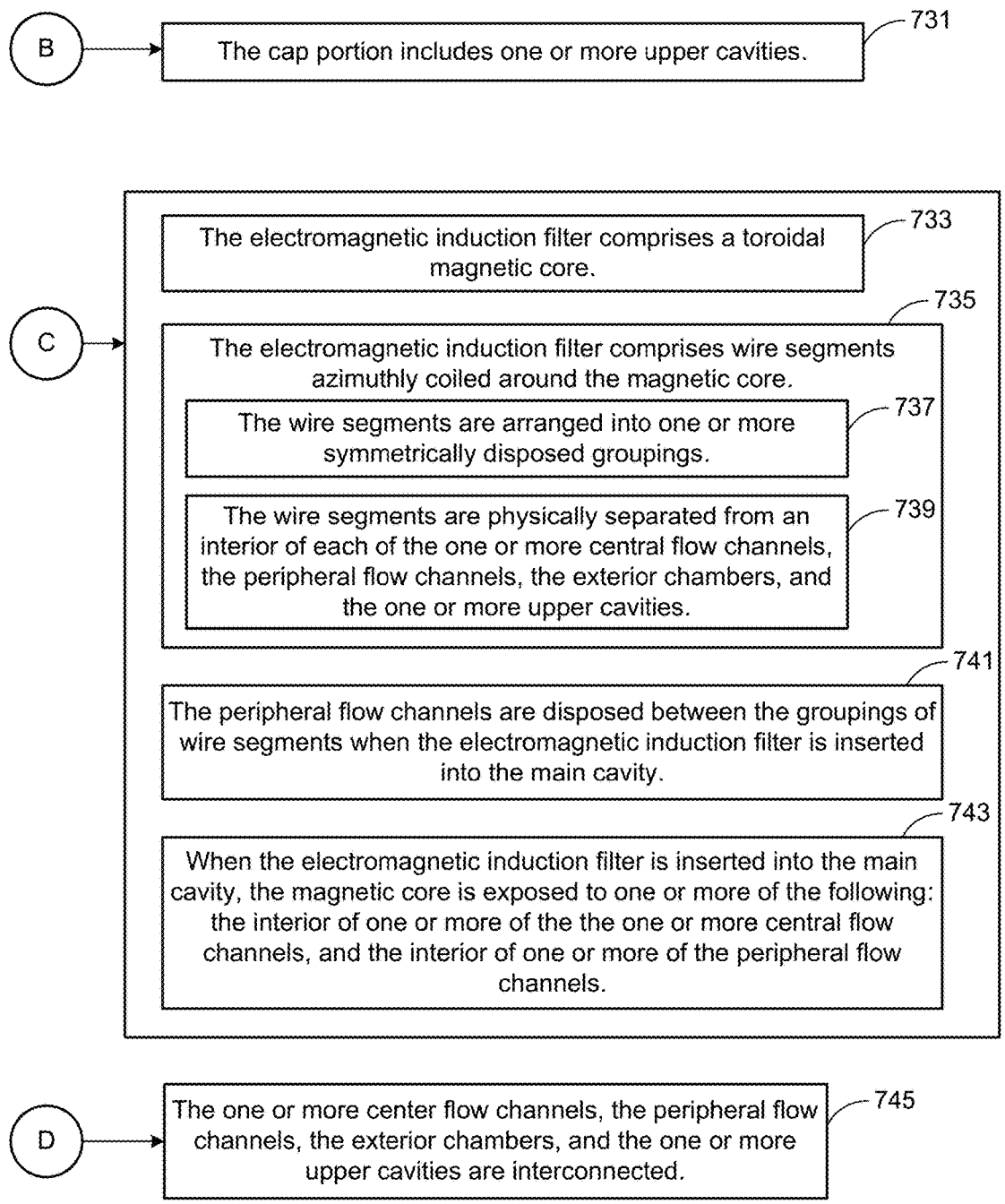

FIGS. 7A-7C illustrate an example method 700 for fabricating a cooling device for an electromagnetic induction (EMI) filter, such as EMI filter 200, in accordance with one or more embodiments. In some embodiments, the cooling device may be any of the cooling devices described herein, such as 300, 300-A, 300-B, and/or 300-C. At operation 701, a base portion of the housing is formed. In some embodiments, the base portion is base portion 302, as described above. The base portion may comprise a cavity 711 configured to house the EMI filter. In some embodiments cavity 711 is cavity 380, as described above. The base portion may further comprise exterior chambers 713 surrounding an exterior surface of the EMI filter. In some embodiments, exterior chambers 713 are exterior chambers 358, as described above.

The base portion may further comprise peripheral flow channels 715 extending the length of the exterior surface of the EMI filter. In some embodiments, peripheral flow channels 715 are peripheral flow channels 356, as described above. In some embodiments, the peripheral flow channels 715 are disposed between 717 the exterior chambers 713. In some embodiments, the peripheral flow channels 715 are symmetrically disposed 719 around the cavity 711.

The base portion may further comprise a plurality of grooves 725. The plurality of grooves 725 includes outer vertical grooves 727, such as outer vertical wire grooves 314. The plurality of grooves 725 may further include inner vertical grooves 728, such as internal vertical wire grooves 316. The plurality of grooves 725 may further include horizontal grooves 729, such as internal horizontal wire grooves 310. In some embodiments, such plurality of grooves 725 are configured to house (730) the wire segments 735 of the EMI filter, as previously described.

At operation 703, a cap portion of the housing is formed. The cap portion may include one or more upper cavities 731, such as the cavities within collection chamber 320. As also previously explained, the base portion and/or the cap portion of the housing may be formed by various machining methods and/or various additive manufacturing processes. Various materials may be used in forming the housing, including the thermoplastics and/or metals previously described.

At operation 705, the electromagnetic induction (EMI) filter is inserted into the cavity. The EMI filter may comprise a toroidal magnetic core 733, such as magnetic core 202. The EMI filter may further comprise wire segments 735, such as wire segments 204, azimuthly coiled around the magnetic core 733. In some embodiments, the wire segments 735 are arranged into one or more symmetrically disposed groupings 737, such as depicted in FIGS. 2A-2B, 3B-3C, 4B, and 6A-H. In some embodiments, the wire segments 735 are physically separated (739) from an interior of each of the one or more central flow channels 721, the peripheral flow channels 715, the exterior chambers 713, and the one or more upper cavities 731.

In some embodiments, the peripheral flow channels 715 are disposed between the groupings 737 of wire segments 735 when the EMI filter is inserted into the main cavity 711. In some embodiments, when the EMI filter is inserted into the main cavity 711, the magnetic core 733 is exposed (743) to one or more of the following: the one or more central flow channels 721, and the interior of one or more of the peripheral flow channels 715.

At operation 707, the EMI filter is enclosed with the cap portion. Once the cap portion has enclosed the EMI filter, the one or more center flow channels 721, the peripheral flow channels 715, the exterior chambers 713, and the one or more upper cavities 731 are interconnected (745). At operation 709, the cap portion is welded to the base portion, including the welding processes previously described. In other embodiments, the cap portion may be attached to the base portion by other means, such as adhesives or other mechanical clips and/or clamps. In some embodiments, the cooling device fabricated in method 700 may be implemented to cool the EMI filter during operation, such as by method 800, described below.

Figure 8A:
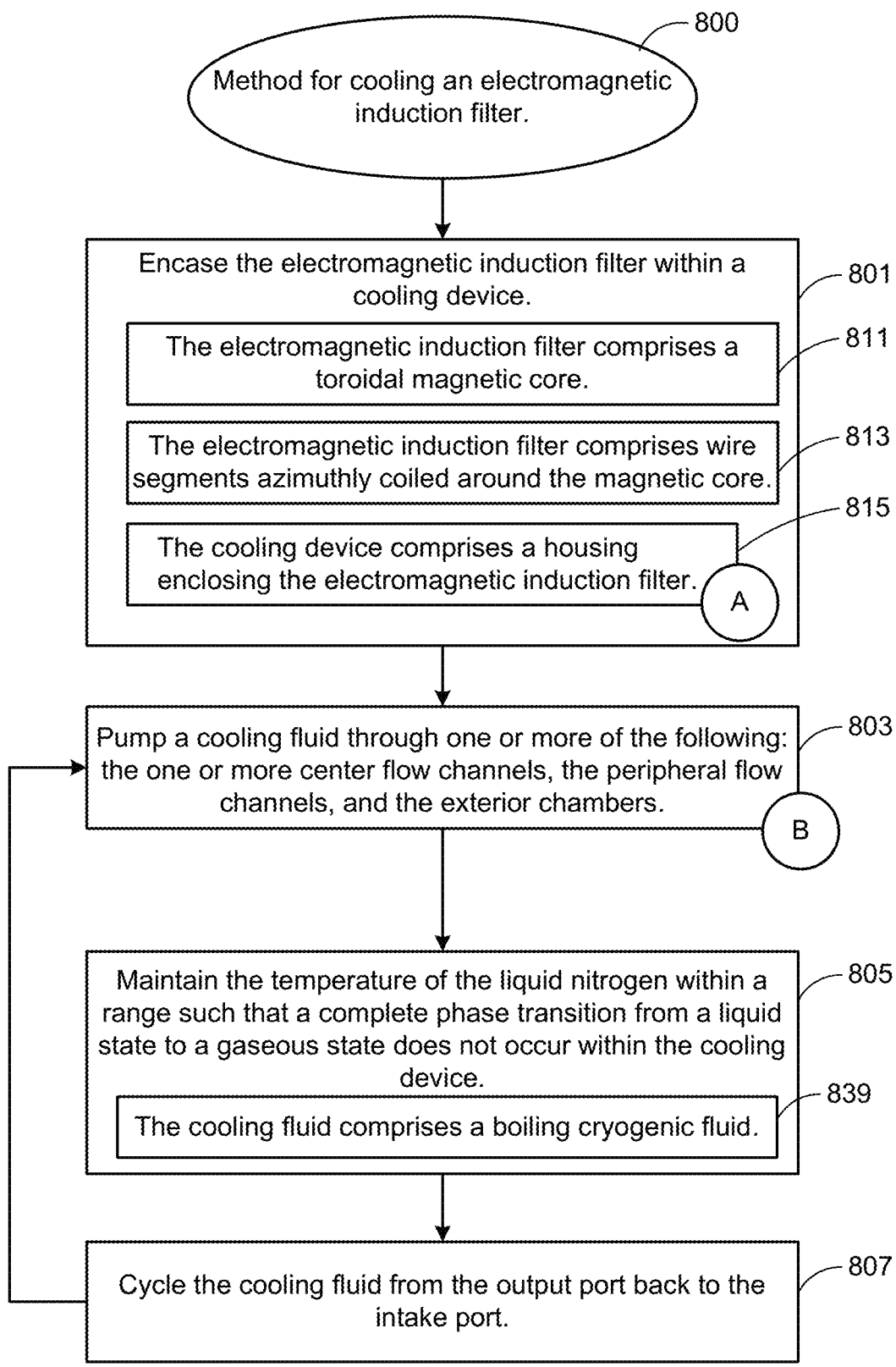
FIGS. 8A-8C illustrate an example method for cooling an electromagnetic induction filter, in accordance with one or more embodiments.
Figure 8B:
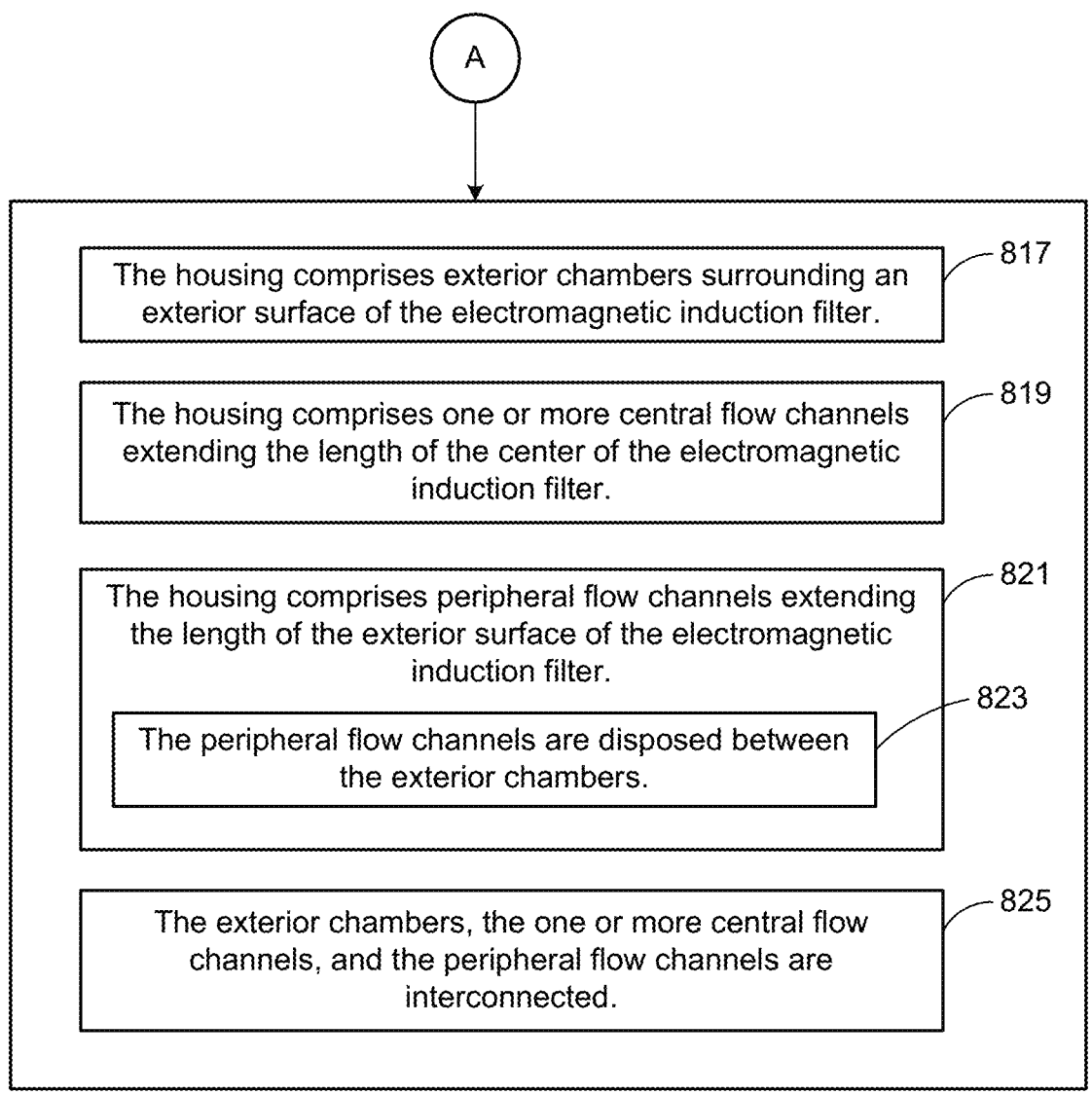
Figure 8C:
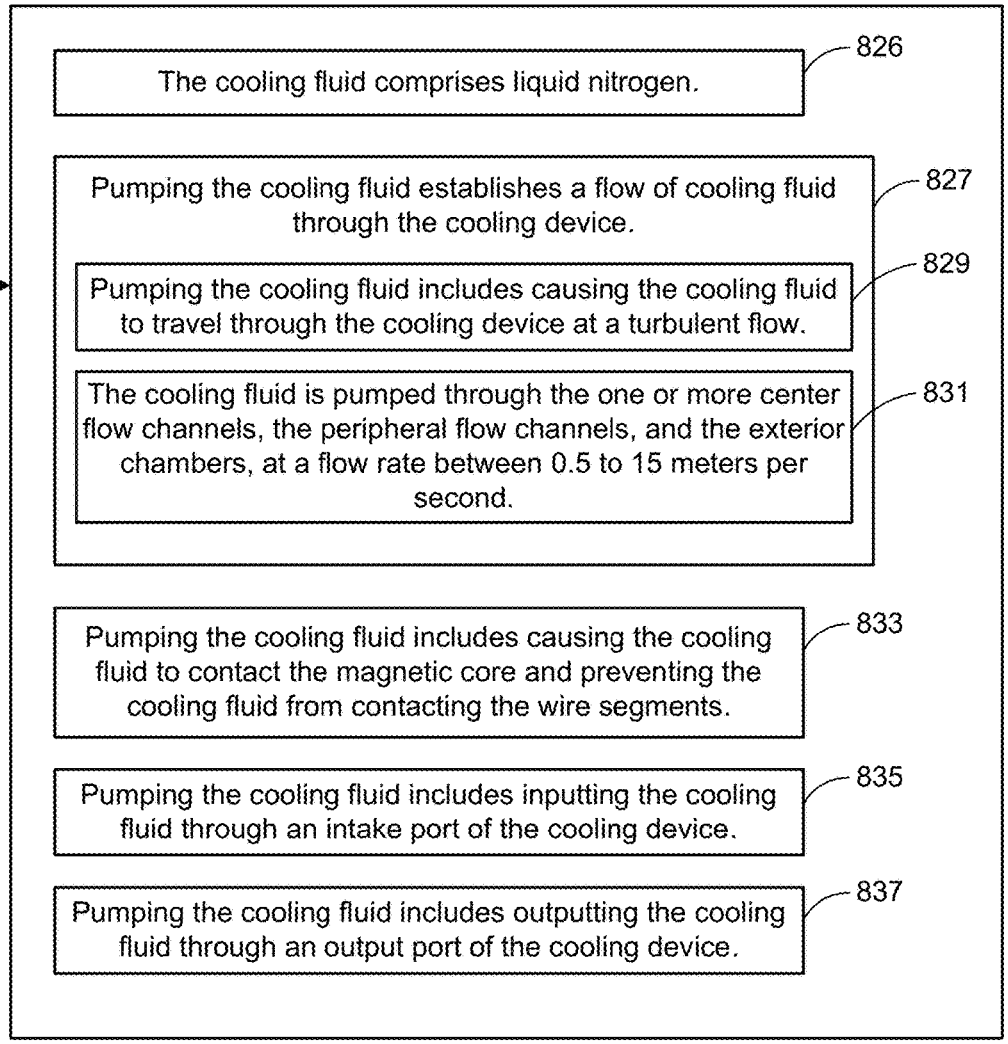

FIGS. 8A-8C illustrate an example method 800 of cooling an electromagnetic induction (EMI) filter, such as EMI filter 200, in accordance with one or more embodiments. At operation 801, the electromagnetic induction (EMI) filter is encased within a cooling device. In some embodiments, the EMI filter comprises a toroidal magnetic core 811, such as magnetic core 202 as described herein. In some embodiments, the EMI filter comprises wire segments 813 azimuthly coiled around the magnetic core 811. In some embodiments wire segments 813 may be wire segments 204, as described herein.

In some embodiments, the cooling device may be any of the cooling devices described herein, such as 300, 300-A, 300-B, and/or 300-C. In some embodiments, the cooling device comprises a housing 815 enclosing the EMI filter. Housing 815 may comprise exterior chambers 817 surrounding an exterior surface of the EMI filter. In some embodiments, exterior chambers 817 are exterior chambers 358 as described herein. Housing 815 may further comprise one or more central flow channels 819 extending the length of the center of the EMI filter. In some embodiments the one or more central flow channels 819 are central flow channels 354, as described herein. Housing 815 may further comprise peripheral flow channels 821 extending the length of the exterior surface of the EMI filter. In some embodiments, peripheral flow channels 821 are peripheral flow channels 356, as herein described. As previously described, peripheral flow channels may be disposed between the exterior chambers 817. In some embodiments, the exterior chambers 817, the one or more central flow channels 819, and the peripheral flow channels 821 are interconnected (825).

In some embodiments, housing 815 may comprise one or more of the following: exterior chambers 817, one or more central flow channels 819, and peripheral flow channels 821. In other words, housing 815 may comprise any combination of exterior chambers 817, central flow channels 819, and peripheral flow channels 821. For example, as depicted in FIGS. 4E and 6C, housing 815 of a cooling device may not include any peripheral flow channels 821, but instead only one exterior chamber 817 that completely surrounds the induction magnetic filter.

At operation 803, a cooling fluid 826 is pumped through one or more of the following: the one or more center flow channels, the peripheral flow channels, and the one or more exterior chambers. In some embodiments, the cooling fluid 826 is pumped by a pump mechanism, such as a pump mechanism 150 previously described with reference to FIG. 1. In some embodiments, the cooling fluid 826 comprises liquid nitrogen. In other embodiments, the cooling fluid may comprise a cooled liquid hydrocarbon fuel, or other cryogenically cooled fluid. In various embodiments, as cooling fluid travels through the cooling device, such as cooling device 300, it may result in cryogenic cooling and removal of more than 780 Watts of thermal power generated during operation of EMI filter 200. In some embodiments, the temperature of the walls of the housing of cooling device 300 may not exceed 90 degrees Kelvin.

In some embodiments, pumping the cooling fluid 826 establishes a flow 827 of cooling fluid 826 through the cooling device. In some embodiments, pumping the cooling fluid 826 includes causing the cooling fluid to travel through the cooling device at a turbulent flow 829. In fluid dynamics, turbulent flow 829 is a flow regime characterized by chaotic changes in pressure and flow velocity. As compared to laminar flow, turbulent flow 829 is a less orderly flow regime that is characterized by eddies or small packets of fluid particles which result in lateral mixing. In some embodiments, the cooling fluid 826 is pumped such that turbulent flow 829 occurs within the exterior chambers 817, the one or more central flow channels 819, and/or the peripheral flow channels 821.

In some embodiments, turbulent flow 829 of the cooling fluid 826 is achieved by pumping the cooling fluid 826 at a sufficient speed and/or pressure. In some embodiments, the cooling fluid 826 is pumped through the one or more center flow channels 819, the peripheral flow channels 821, and the exterior chambers 817, at a flow rate 831 between 0.5 and 15 meters per second. In some embodiments, the cooling fluid 826 is pumped through the one or more center flow channels 819, the peripheral flow channels 821, and the exterior chambers 817, at pressures between 0.5 to 3 atmospheres.

In some embodiments, the cryogenic flow in the cooling device may generate an average chamber pressure of approximately 20-70 PSI. In some embodiments, the walls of the cryogenic flow path may withstand a maximum pressure of 700 PSI. In some embodiments, the outer surface of the cooling device housing may withstand pressures of about 13 PSI. In various embodiments, the flow rate 831 and/or pressures may vary in different configurations of cooling devices.

In some embodiments, pumping the cooling fluid 826 includes causing the cooling fluid 826 to contact 833 the magnetic core 811 and preventing the cooling fluid 826 from contacting the wire segments 813. As previously described, this may allow direct cooling of the magnetic core 811 and enable greater cooling ability by the cooling fluid 826. In some embodiments, pumping the cooling fluid 826 includes inputting the cooling fluid through an intake port 835 of the cooling device. Such intake port 835 may be intake port 306, as described above. In some embodiments, pumping the cooling fluid 826 includes outputting the cooling fluid 826 through an output port 837 of the cooling device. Such output port may be output port 308, as described above.

At operation 805, the temperature of the liquid nitrogen is maintained within a range such that a complete phase transition from a liquid state to a gaseous state does not occur within the cooling device. In some embodiments, the cooling fluid 826 comprises a boiling cryogenic fluid 839. For example, cooling fluid 826 comprising liquid nitrogen may be maintained at a temperature gradient between 77 degrees Kelvin to 92 degrees Kelvin. In some embodiments, the heat generated from the EMI filter may contribute to the maintenance of the desired temperature of the cooling fluid 826. As such, the cooling fluid will comprise a slush of liquid and turbulent gas. Such slush may optimize the heat transfer between the EMI filter and cooling fluid. Such incomplete phase transition between liquid and gas may also contribute to the turbulent flow 829 of the cooling fluid 826. In other embodiments, where the cooling fluid comprises a different composition, such cooling fluid may also be maintained within a corresponding temperature range, such that a complete phase transition does not occur within the cooling device.

At operation 807, the cooling fluid 826 is cycled from the output port back into the intake port. In some embodiments, the cycling of cooling fluid 826 is facilitated by a pump mechanism, such as pump mechanism 150 previously described with reference to FIG. 1. In some embodiments operation 807 is an optional step, and the cooling fluid is not cycled back into the cooling device in other embodiments.

Examples of Aircraft and Methods of Fabricating and Operating Aircraft

Figure 9:
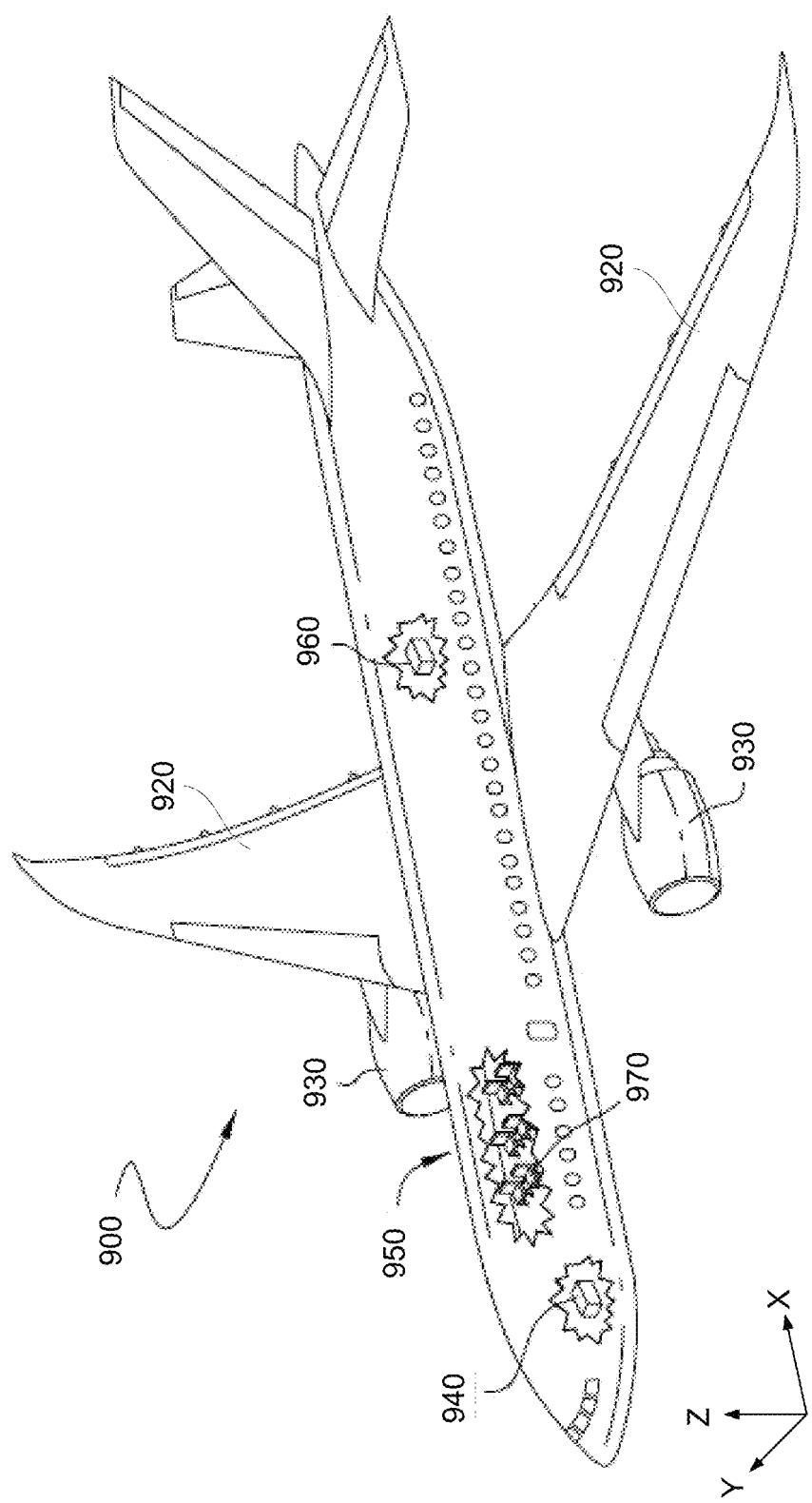
FIG. 9 is a schematic illustration of an aircraft, in accordance with some embodiments.

To better understand various aspects of implementation of the described systems and techniques, a brief description of an aircraft and aircraft wing is now presented. FIG. 9 is a schematic illustration of aircraft 900, in accordance with some embodiments. As depicted in FIG. 9, aircraft 900 is defined by a longitudinal axis (X-axis), a lateral axis (Y-axis), and a vertical axis (Z-axis). In various embodiments, aircraft 900 comprises airframe 950 with interior 970. Aircraft 900 includes wings 920 coupled to airframe 950. Aircraft 900 may also include engines 930 supported by wings 920. In some embodiments, aircraft 900 further includes a number of high-level inspection systems such as electrical inspection system 940 and environmental inspection system 960. In other embodiments, any number of other inspection systems may be included.

Aircraft 900 shown in FIG. 9 is one example of a vehicle for which a cooling device for an EMI filter may be operated at various stages of the build process, in accordance with illustrative embodiments. Although an aerospace example is shown, the principles disclosed herein may be applied to other industries, such as the automotive industry. Accordingly, in addition to aircraft 900, the principles disclosed herein may apply to other vehicles, e.g., land vehicles, marine vehicles, space vehicles, etc.

Figure 10:
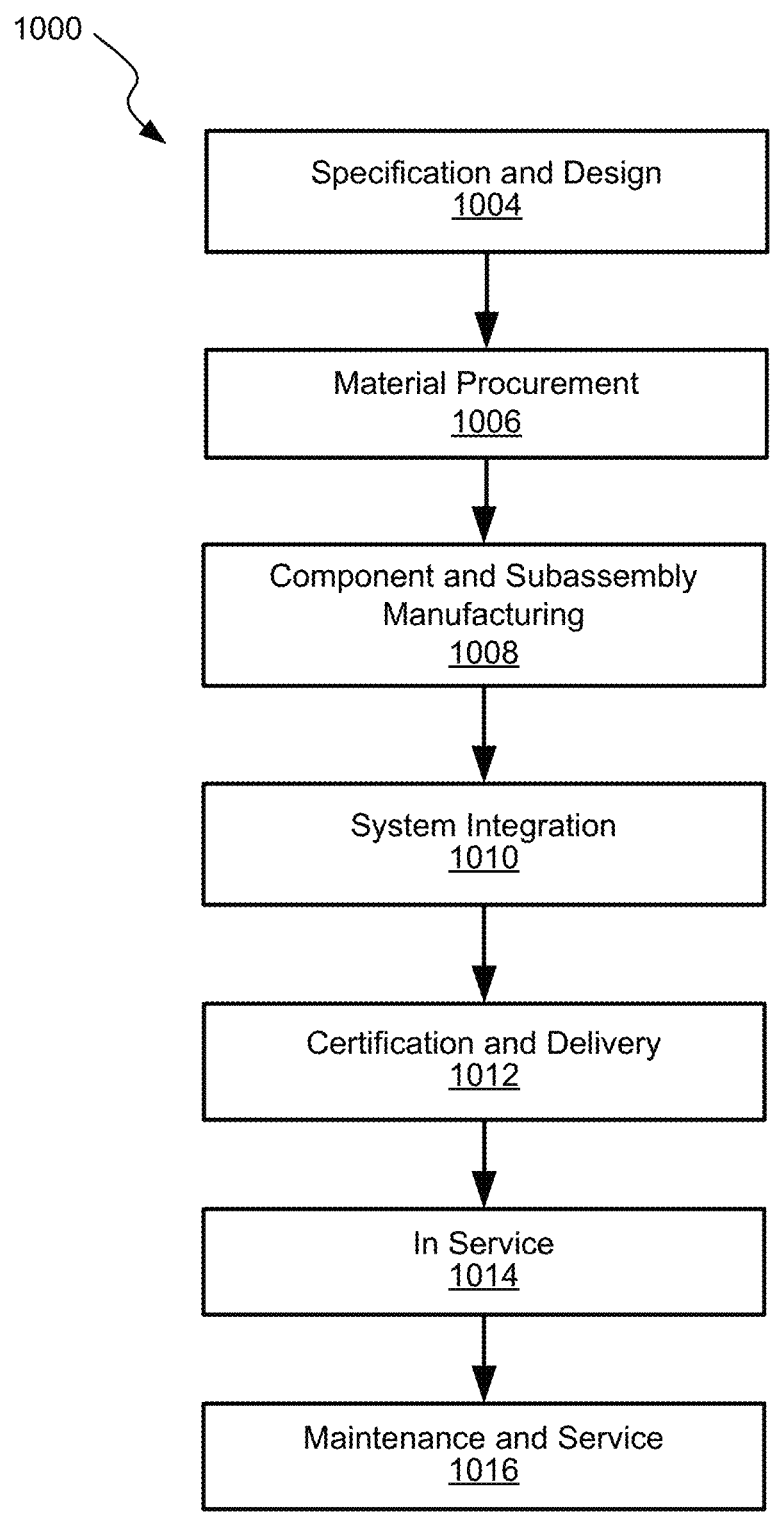
FIG. 10 is a block diagram of aircraft production and service methodology that may utilize methods and assemblies described herein.

Examples of the present disclosure may be described in the context of aircraft manufacturing and service method 1000 as shown in FIG. 10 and aircraft 900 as shown in FIG. 9. During pre-production, illustrative method 1000 may include specification and design (block 1004) of aircraft 900 and material procurement (block 1006). During production, component and subassembly manufacturing (block 1008) and system integration (block 1010) of aircraft 900 may take place. Described systems, methods, and assemblies formed by these methods, can be used in any of specification and design (block 1004) of aircraft 900, material procurement (block 1006), component and subassembly manufacturing (block 1008), and/or system integration (block 1010) of aircraft 900.

Thereafter, aircraft 900 may go through certification and delivery (block 1012) to be placed in service (block 1014). While in service, aircraft 900 may be scheduled for routine maintenance and service (block 1016). Routine maintenance and service may include modification, reconfiguration, refurbishment, etc. of one or more inspection systems of aircraft 900. Described systems, methods, and assemblies formed by these methods, can be used in any of certification and delivery (block 1012), service (block 1014), and/or routine maintenance and service (block 1016).

Each of the processes of illustrative method 1000 may be performed or carried out by an inspection system integrator, a third party, and/or an operator (e.g., a customer). For the purposes of this description, an inspection system integrator may include, without limitation, any number of aircraft manufacturers and major-inspection system subcontractors; a third party may include, without limitation, any number of vendors, subcontractors, and suppliers; and an operator may be an airline, leasing company, military entity, service organization, and so on.

Apparatus(es) and method(s) shown or described herein may be employed during any one or more of the stages of manufacturing and service method (illustrative method 1000). For example, components or subassemblies corresponding to component and subassembly manufacturing (block 1008) may be fabricated or manufactured in a manner similar to components or subassemblies produced while aircraft 900 is in service (block 1014). Also, one or more examples of the apparatus(es), method(s), or combination thereof may be utilized during production stages (block 1008) and (block 1010), for example, by substantially expediting assembly of or reducing the cost of aircraft 900. Similarly, one or more examples of the apparatus or method realizations, or a combination thereof, may be utilized, for example and without limitation, while aircraft 900 is in service (block 1014) and/or during maintenance and service (block 1016).

CONCLUSION

Different examples of the apparatus(es) and method(s) disclosed herein include a variety of components, features, and functionalities. It should be understood that the various examples of the apparatus(es) and method(s) disclosed herein may include any of the components, features, and functionalities of any of the other examples of the apparatus(es) and method(s) disclosed herein in any combination, and all of such possibilities are intended to be within the spirit and scope of the present disclosure.

Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A cooling device comprising:
   a housing configured to enclose an electromagnetic induction filter, wherein the housing comprises one or more of the following:
   one or more exterior chambers configured to surround an exterior surface of the electromagnetic induction filter;
   one or more central flow channels configured to extend the length of the center of the electromagnetic induction filter; and
   peripheral flow channels configured to extend the length of the exterior surface of the electromagnetic induction filter;
   wherein the one or more central flow channels and the peripheral flow channels are interconnected; and
   wherein at least one exterior chamber is interconnected with at least one peripheral flow channel via one or more lateral flow channels.

2. The cooling device of claim 1, wherein the housing further comprises a base portion and a cap portion, wherein the electromagnetic induction filter is disposed within a main cavity of the base portion and is enclosed by the cap portion.

3. The cooling device of claim 2, wherein the cap portion includes one or more upper cavities, wherein the one or more upper cavities are interconnected with one or more of the following:
   the one or more central flow channels and the peripheral flow channels.

4. The cooling device of claim 1, wherein the peripheral flow channels and the one or more central flow channels are disposed symmetrically around a longitudinal axis of the cooling device, and wherein the peripheral flow channels are symmetrically offset around the longitudinal axis of the cooling device relative to the one or more central flow channels.

5. The cooling device of claim 1, further comprising a pump mechanism for pumping a cooling fluid through one or more of the following: the one or more central flow channels, the peripheral flow channels, and the one or more exterior chambers.

6. The cooling device of claim 5, wherein the cooling fluid enters an intake port and exits from an output port.

7. The cooling device of claim 5, wherein the cooling fluid comprises a boiling cryogenic fluid.

8. The cooling device of claim 1, wherein the electromagnetic induction filter comprises a toroidal magnetic core and wire segments azimuthly coiled around the magnetic core, wherein the wire segments are arranged into one or more symmetrically disposed groupings.

9. The cooling device of claim 8, wherein the peripheral flow channels are disposed between the groupings of wire segments.

10. The cooling device of claim 8, wherein the magnetic core is exposed to an interior of one or more of the following:
the one or more central flow channels, and the peripheral flow channels.

11. The cooling device of claim 8, wherein the wire segments are physically separated from an interior of each of the one or more central flow channels, the peripheral flow channels, and the one or more exterior chambers.

12. A system comprising:
an electromagnetic induction filter;
a cooling device comprising a housing enclosing the electromagnetic induction filter, wherein the housing comprises one or more of the following:
one or more exterior chambers surrounding an exterior surface of the electromagnetic induction filter;
one or more central flow channels extending the length of the center of the electromagnetic induction filter; and
peripheral flow channels extending the length of the exterior surface of the electromagnetic induction filter;
wherein the one or more central flow channels and the peripheral flow channels are interconnected; and
wherein the exterior chambers are interconnected with the peripheral flow channels via one or more lateral flow channels.

13. The system of claim 12, wherein the housing further comprises a base portion and a cap portion, wherein the electromagnetic induction filter is disposed within a main cavity of the base portion and is enclosed by the cap portion.

14. The system of claim 13, wherein the cap portion includes one or more upper cavities, wherein the one or more upper cavities are interconnected with one or more of the following:
the one or more central flow channels and the peripheral flow channels.

15. The system of claim 12, wherein the peripheral flow channels and the one or more central flow channels are disposed symmetrically around a longitudinal axis of the cooling device, and wherein the peripheral flow channels are symmetrically offset around the longitudinal axis of the cooling device relative to the one or more central flow channels.

16. The system of claim 12, wherein the electromagnetic induction filter comprises a toroidal magnetic core and wire segments azimuthly coiled around the magnetic core, wherein the wire segments are arranged into one or more symmetrically disposed groupings.

17. The system of claim 16, wherein the peripheral flow channels are disposed between the groupings of wire segments.

18. The system of claim 16, wherein the magnetic core is exposed to an interior of one or more of the following:
the one or more central flow channels, and the peripheral flow channels.

19. The system of claim 16, wherein the wire segments are physically separated from an interior of each of the one or more central flow channels, the peripheral flow channels, and the one or more exterior chambers.

20. A cooling device comprising:
a housing configured to enclose an electromagnetic induction filter, wherein the housing comprises one or more of the following:
one or more exterior chambers configured to surround an exterior surface of the electromagnetic induction filter;
one or more central flow channels configured to extend the of the center of the electromagnetic induction filter; and
peripheral flow channels configured to extend the length of the exterior surface of the electromagnetic induction filter;
wherein the peripheral flow channels and the one or more central flow channels are disposed symmetrically around a longitudinal axis of the cooling device; and
wherein the peripheral flow channels are symmetrically offset around the longitudinal axis of the cooling device relative to the one or more central flow channels.

* * * * *